(12) United States Patent
Lai et al.

(10) Patent No.: US 12,501,689 B2
(45) Date of Patent: Dec. 16, 2025

(54) NANOSTRUCTURE FIELD-EFFECT TRANSISTOR DEVICE AND METHOD OF FORMING

(71) Applicant: Taiwan Semiconductor Manufacturing Co., Ltd., Hsinchu (TW)

(72) Inventors: Te-Yang Lai, Hsinchu (TW); Hsueh-Ju Chen, Taipei (TW); Tsung-Da Lin, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 18/357,449

(22) Filed: Jul. 24, 2023

(65) Prior Publication Data

US 2023/0369124 A1    Nov. 16, 2023

Related U.S. Application Data

(62) Division of application No. 17/147,134, filed on Jan. 12, 2021, now Pat. No. 11,791,216.

(Continued)

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02236* (2013.01); *H01L 21/02252* (2013.01);
(Continued)

(58) Field of Classification Search
CPC ............ H10D 84/038; H10D 30/6735; H10D 62/121; H10D 84/0181; H01L 21/02603; H01L 21/02255
See application file for complete search history.

(56) References Cited

U.S. PATENT DOCUMENTS 9,209,247 B2   12/2015   Colinge et al.
9,224,833 B2   12/2015   Chen et al.
(Continued)

FOREIGN PATENT DOCUMENTS

KR   20180027186 A   3/2018
KR   20190024625 A   3/2019
(Continued)

*Primary Examiner* — Brian Turner
(74) *Attorney, Agent, or Firm* — Slater Matsil, LLP

(57) ABSTRACT

A method of forming a semiconductor device includes: forming, in a first device region of the semiconductor device, first nanostructures over a first fin that protrudes above a substrate; forming, in a second device region of the semiconductor device, second nanostructures over a second fin that protrudes above the substrate, where the first and the second nanostructures include a semiconductor material and extend parallel to an upper surface of the substrate; forming a dielectric material around the first and the second nanostructures; forming a first hard mask layer in the first device region around the first nanostructures and in the second device region around the second nanostructures; removing the first hard mask layer from the second device region after forming the first hard mask layer; and after removing the first hard mask layer, increasing a first thickness of the dielectric material around the second nanostructures by performing an oxidization process.

20 Claims, 31 Drawing Sheets

Related U.S. Application Data

(60) Provisional application No. 63/078,453, filed on Sep. 15, 2020.

(51) Int. Cl.
  *H10D 30/01* (2025.01)
  *H10D 30/67* (2025.01)
  *H10D 62/10* (2025.01)
  *H10D 84/01* (2025.01)
  *H10D 84/83* (2025.01)

(52) U.S. Cl.
  CPC .. *H01L 21/02532* (2013.01); *H01L 21/02603* (2013.01); *H10D 30/031* (2025.01); *H10D 30/6735* (2025.01); *H10D 30/6757* (2025.01); *H10D 62/121* (2025.01); *H10D 84/0128* (2025.01); *H10D 84/0135* (2025.01); *H10D 84/0144* (2025.01); *H10D 84/83* (2025.01); *H10D 30/6736* (2025.01)

(56) References Cited

U.S. PATENT DOCUMENTS

| | | |
|---|---|---|
| 9,251,888 B1 | 2/2016 | Liaw |
| 10,720,431 B1 | 7/2020 | Cheng et al. |
| 10,763,177 B1 | 9/2020 | Zhang et al. |
| 10,847,515 B2 | 11/2020 | Kim et al. |
| 11,056,400 B2 | 7/2021 | Cheng et al. |
| 11,101,360 B2 | 8/2021 | Peng et al. |
| 11,335,604 B2 | 5/2022 | Cheng et al. |
| 11,444,081 B2 | 9/2022 | Kang et al. |
| 2008/0070367 A1 | 3/2008 | Pae et al. |
| 2015/0034899 A1 | 2/2015 | Ching et al. |
| 2015/0048442 A1 | 2/2015 | Colinge et al. |
| 2015/0303270 A1 | 10/2015 | Liaw |
| 2016/0204195 A1* | 7/2016 | Wen ............... H10D 30/014 438/157 |
| 2017/0104060 A1 | 4/2017 | Balakrishnan et al. |
| 2018/0114727 A1* | 4/2018 | Rodder ............ H10D 30/673 |
| 2019/0088798 A1 | 3/2019 | Kim et al. |
| 2019/0259757 A1* | 8/2019 | Ching ............ H10D 84/0158 |
| 2019/0393097 A1 | 12/2019 | Tapily et al. |
| 2020/0006356 A1 | 1/2020 | Ando et al. |
| 2020/0013784 A1 | 1/2020 | An et al. |
| 2020/0083219 A1* | 3/2020 | Kang ................ B82Y 10/00 |
| 2020/0194565 A1 | 6/2020 | Chung et al. |
| 2020/0258785 A1 | 8/2020 | Zhang et al. |
| 2021/0184001 A1 | 6/2021 | Trivedi et al. |

FOREIGN PATENT DOCUMENTS

| | | |
|---|---|---|
| KR | 20190031855 A | 3/2019 |
| KR | 20200005419 A | 1/2020 |
| KR | 20200029264 A | 3/2020 |
| KR | 20200050353 A | 5/2020 |
| KR | 20200066224 A | 6/2020 |

\* cited by examiner

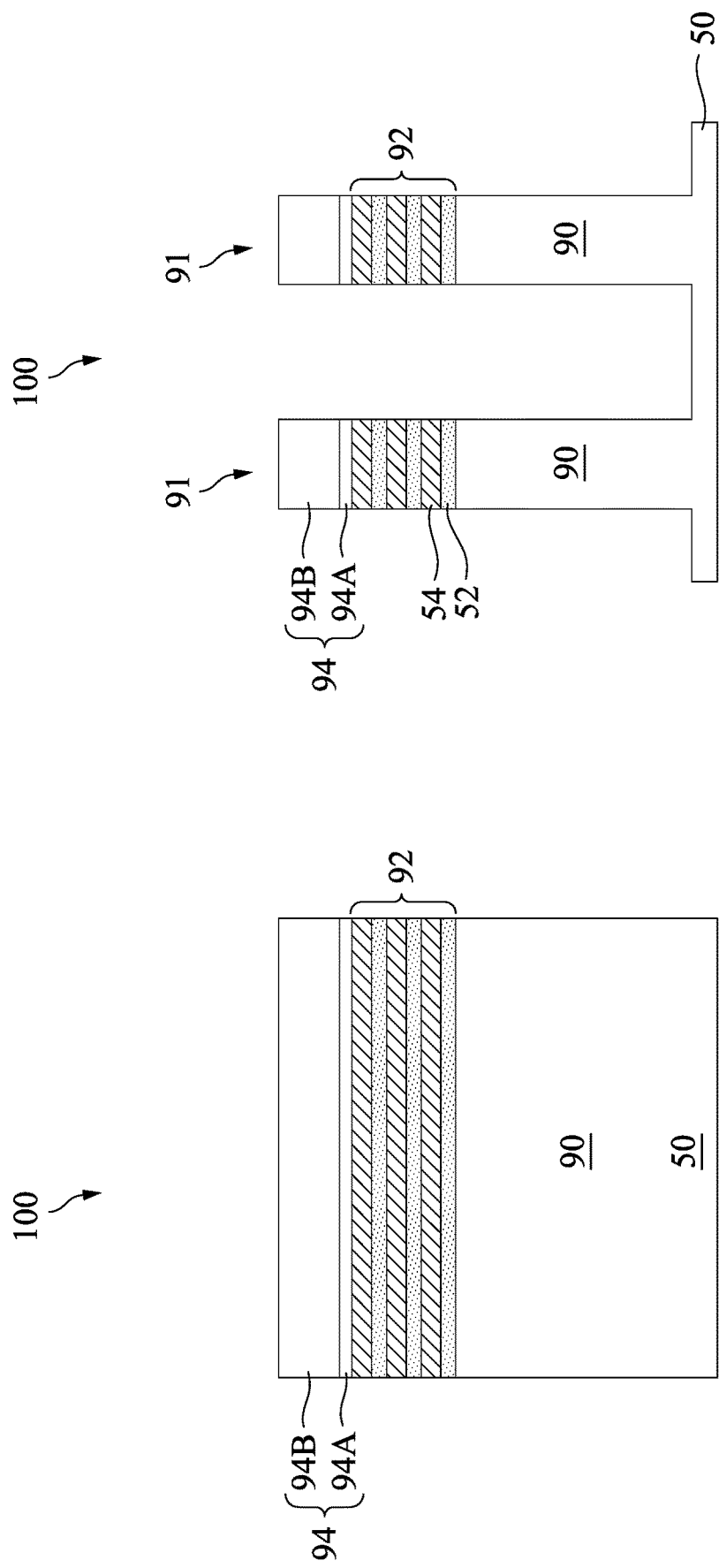

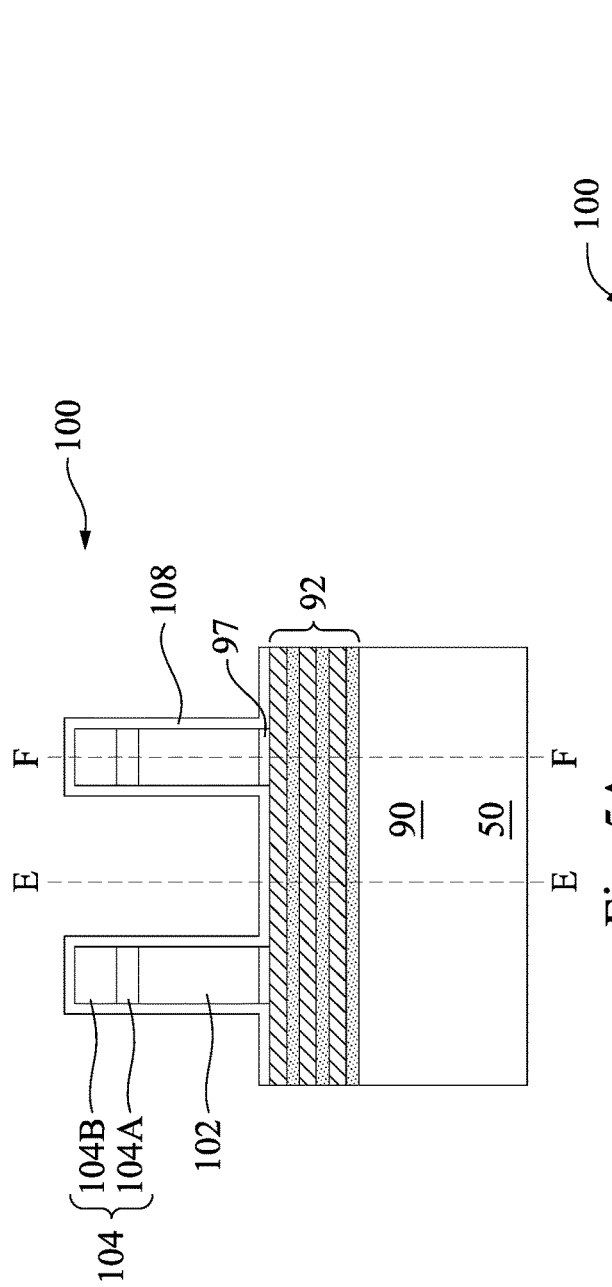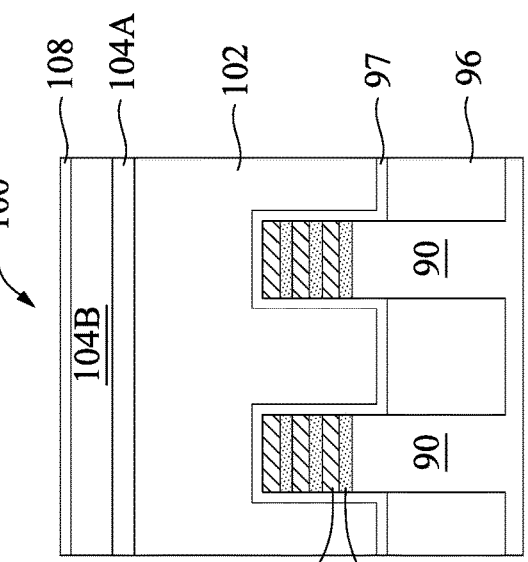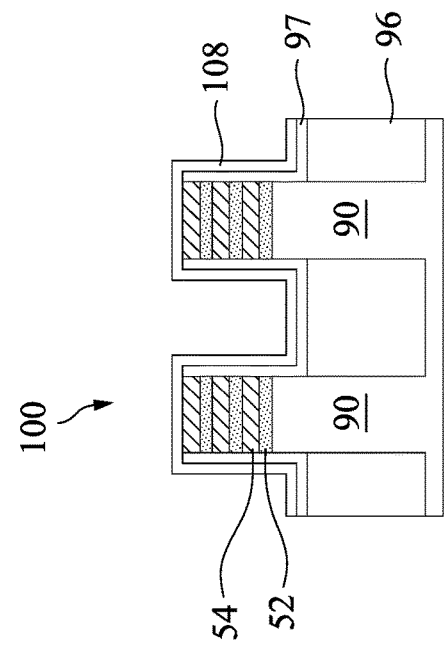

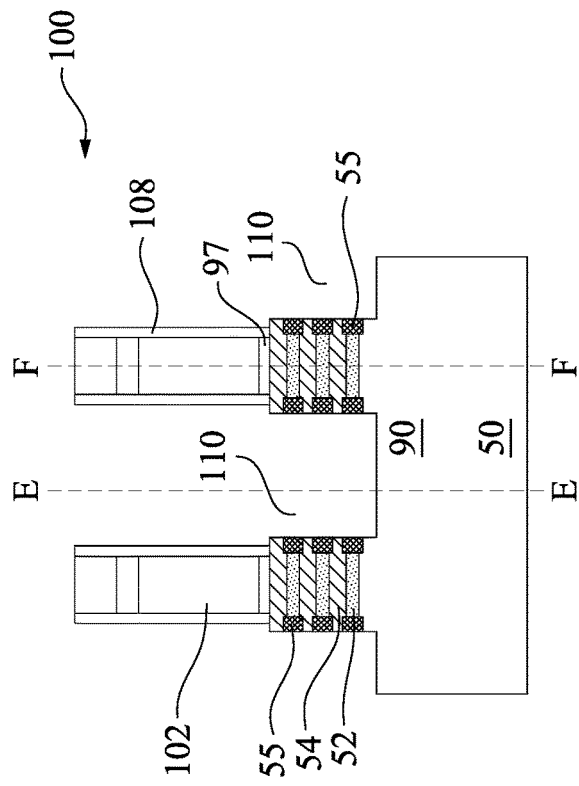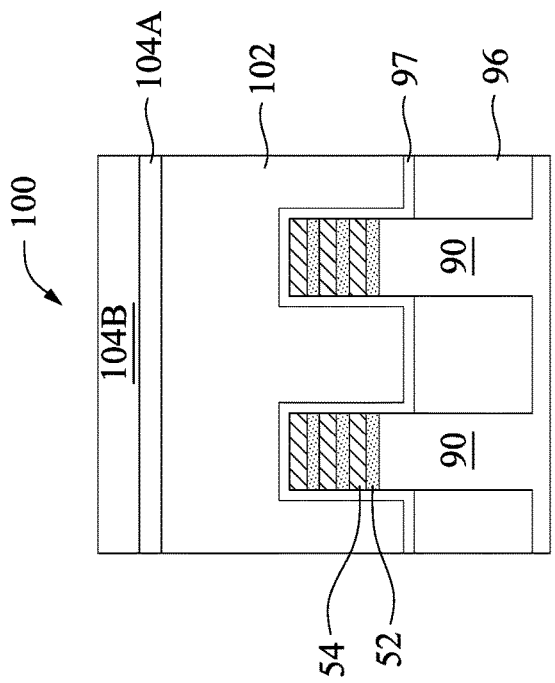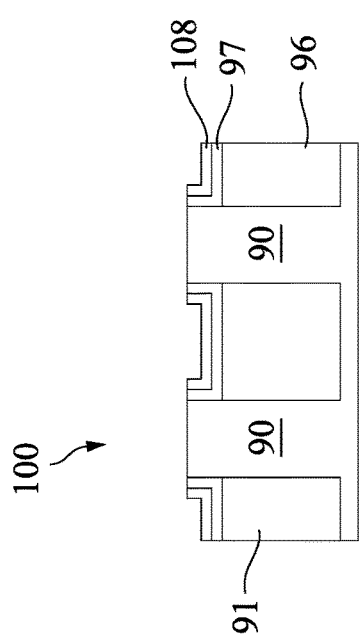
Fig. 6A
Fig. 6B
Fig. 6C

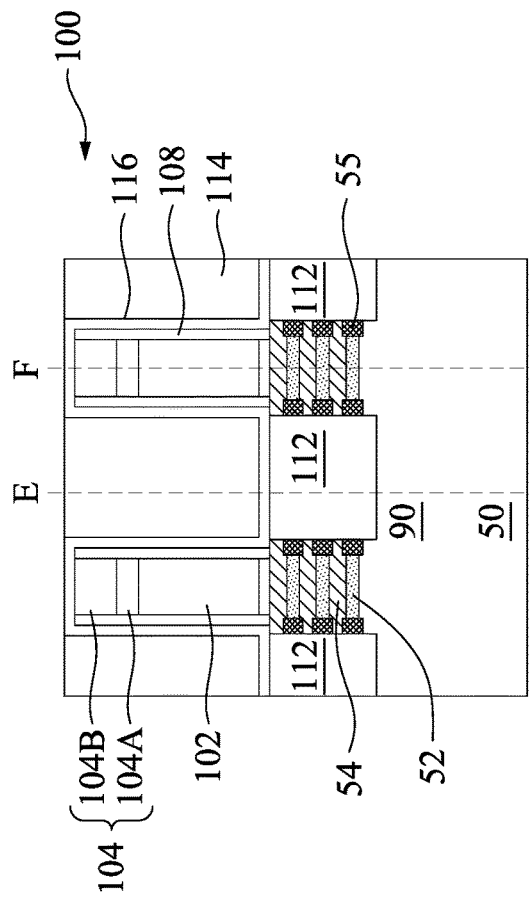
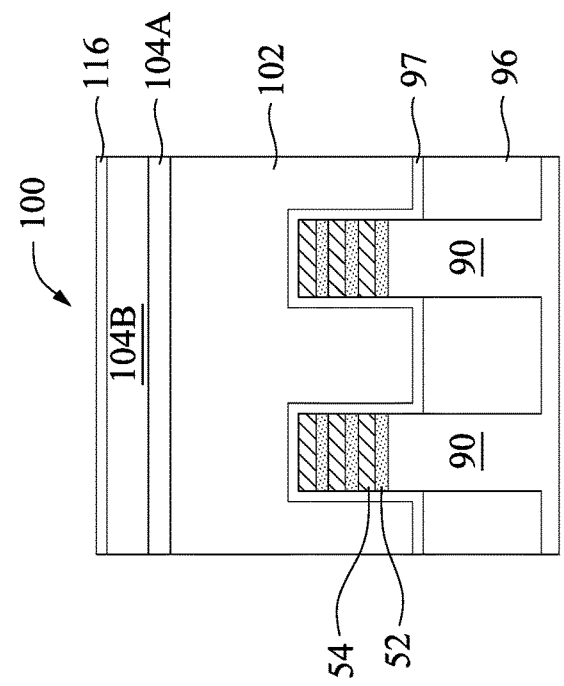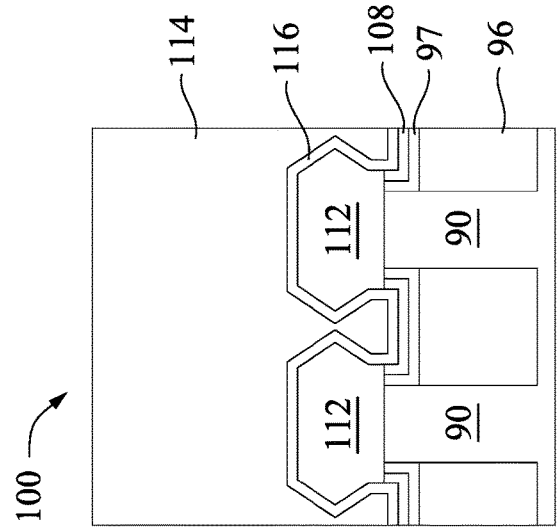
Fig. 7A
Fig. 7B
Fig. 7C

NANOSTRUCTURE FIELD-EFFECT TRANSISTOR DEVICE AND METHOD OF FORMING

PRIORITY CLAIM AND CROSS-REFERENCE

This application is a divisional of U.S. patent application Ser. No. 17/147,134, filed Jan. 12, 2021 and entitled "Nanostructure Field-Effect Transistor Device and Method of Forming," which claims the benefit of U.S. Provisional Application No. 63/078,453, filed on Sep. 15, 2020 and entitled "Method of Multiple Gate Oxide Fabrication on Nanosheet Device," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A-5C, 6A-6C, 7A-7C, 8A, 8B, 9A, 9B, 10A, 10B, 11A, 11B, 12A, 12B, 13A, 13B, 14A, 14B, 15A, 15B, 16A, 16B, 17A, 17B, 18A and 18B are cross-sectional views of a nanostructure field-effect transistor device at various stages of manufacturing, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming a semiconductor device includes: forming, in a first device region of the semiconductor device, first nanostructures (e.g., nanosheets or nanowires) over a first fin, the first fin protruding above a substrate; forming, in a second device region of the semiconductor device, second nanostructures over a second fin, the second fin protruding above the substrate, where the first nanostructures and the second nanostructures comprise a first semiconductor material and extend parallel to a major upper surface of the substrate. The method further includes: forming an interfacial layer (e.g., a gate oxide layer) around the first nanostructures and around the second nanostructures; forming a patterned hard mask layer in the first device region but not in the second device region; and performing an oxidization process to increase a first thickness of the interfacial layer in the second device region. Due to the patterned hard mask layer shielding the first device region from the oxidization process, a second thickness of the interfacial layer in the first device region remains unchanged by the oxidization process, or is increased by a lesser amount than the first thickness of the interfacial layer in the second device region. The disclosed embodiments allow gate oxide layer having different thicknesses to be formed in different device regions (e.g., logic device region and I/O device region) to achieve different performance targets, such as leakage current and power consumption.

Figure 1:
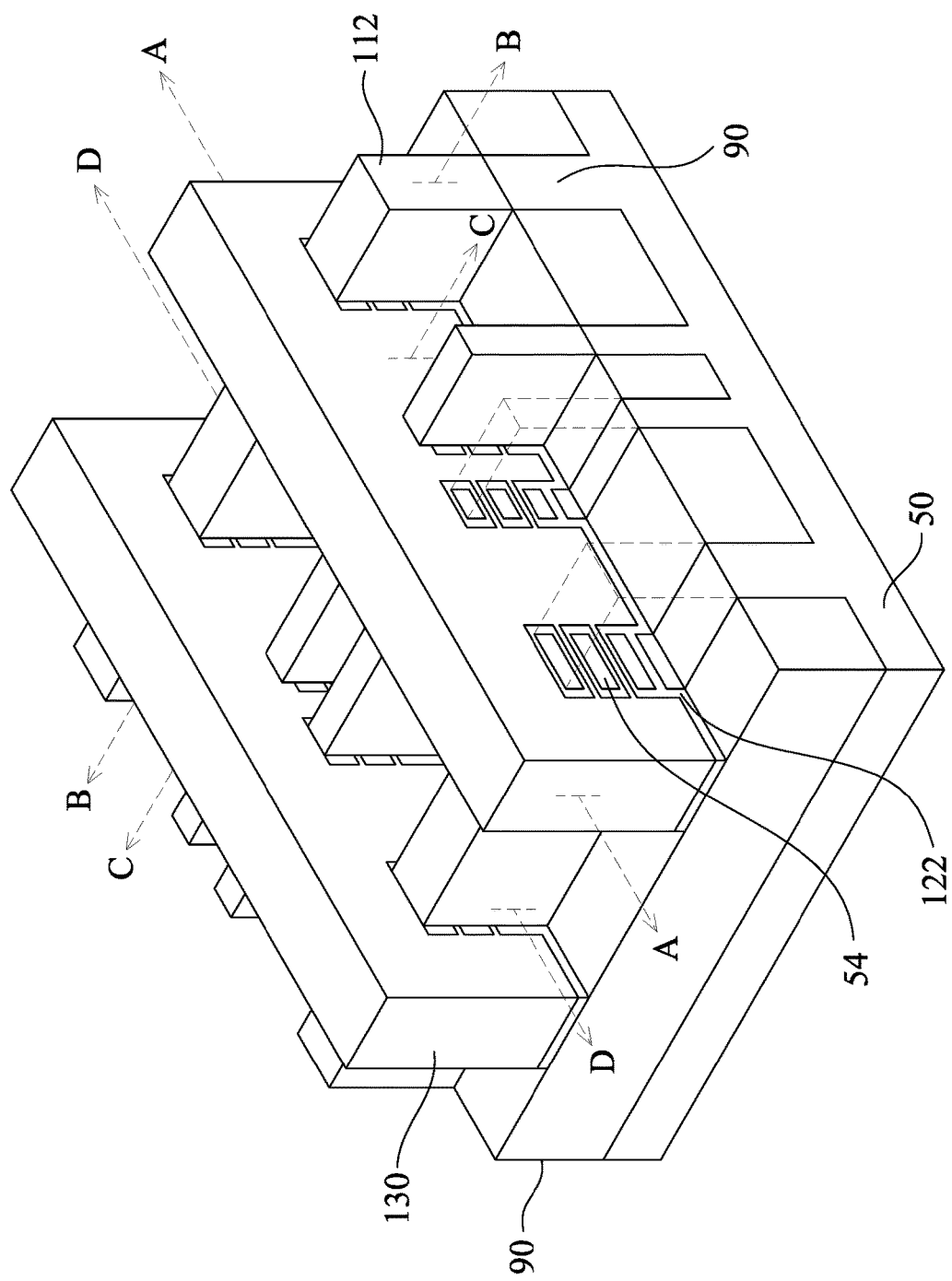
FIG. 1 illustrates an example of a nanostructure field-effect transistor (NSFET) device in a three-dimensional view, in accordance with some embodiments.

FIG. 1 illustrates an example of a nanostructure field-effect transistor (NSFET) device in a three-dimensional view, in accordance with some embodiments. The NSFET device comprises semiconductor fin structures (also referred to as fin structures) protruding above a substrate 50, where each semiconductor fin structure includes a semiconductor fin 90 (also referred to as fins) and nanostructures 54 overlying the semiconductor fins 90. A gate electrode 130 (e.g., a metal gate) is disposed over the fin structures, and source/drain regions 112 are formed on opposing sides of the gate electrode 130. The nanostructures 54 are disposed over the semiconductor fins 90 and between source/drain regions 112. Isolation regions 96 are formed on opposing sides of the fin structures. A gate dielectric layer 122 is formed around the nanostructures 54. Gate electrodes 130 are over and around the gate dielectric layer 122.

FIG. 1 further illustrates reference cross-sections that are used in later figures. Cross-section A-A is along a longitudinal axis of a gate electrode 130 and in a direction, for example, perpendicular to the direction of current flow between the source/drain regions 112 of a NSFET device. Cross-section B-B is perpendicular to cross-section A-A and is along a longitudinal axis of a semiconductor fin 90 and in a direction of, for example, a current flow between the source/drain regions 112 of the NSFET device. Cross-section C-C is parallel to cross-section B-B and between two neighboring fin structures. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5C, 6A-6C, 7A-7C, 8A, 8B, 9A, 9B, 10A, 10B, 11A, 11B, 12A, 12B, 13A, 13B, 14A, 14B, 15A, 15B, 16A, 16B, 17A, 17B, 18A and 18B are cross-sectional views of a nanostructure field-effect transistor (NSFET) device 100 at various stages of manufacturing, in accordance with an embodiment.

Figure 2:
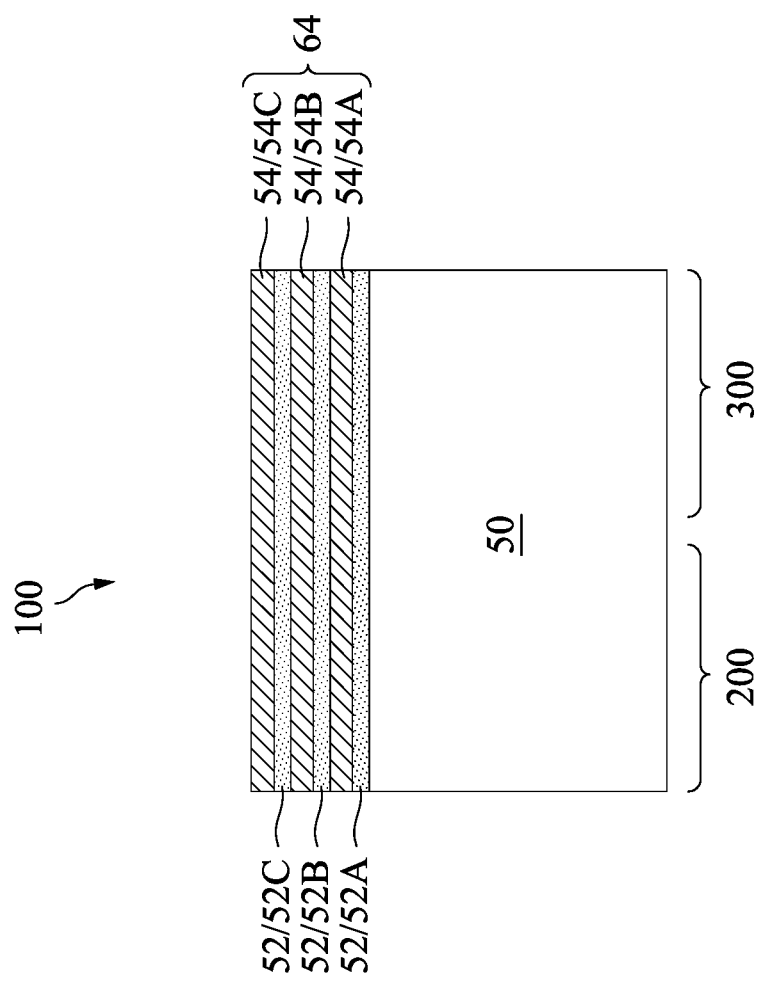

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of p-type FETs, such as silicon germanium ($Si_xGe_{1-x}$, where x is in the range of 0 to 1), and the second semiconductor material 54 is an epitaxial material appropriate for forming channel regions of n-type FETs, such as silicon. The multi-layer stacks 64 (which may also be referred to as an epitaxial material stack) will be patterned to form channel regions of an NSFET in subsequent processing. In particular, the multi-layer stacks 64 will be patterned and etched to form horizontal nanostructures (e.g., nanosheets or nanowires), with the channel regions of the resulting NSFET including multiple horizontal nanostructures.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

As illustrated in FIG. 2, the substrate 50 has a first portion in a first device region 200 of the NSFET device 100, and has a second portion in a second device region 300 of the NSFET device 100. Semiconductor devices (e.g., transistors) formed in the first device region 200 and the second device region 300 are of the same type (e.g., p-type devices or n-type devices), but with different thicknesses for the gate oxide of the transistors in order to achieve different performance specifications, in some embodiments. For example, the first device region 200 may be a logic device region and the second device region 300 may be an input/output (I/O) device region, where the devices (e.g., transistors) formed in the I/O device region have thicker gate oxide (see, e.g., FIG. 17B) and lower leakage current than devices formed in the logic device region. As another example, both the first device region 200 and the second device region 300 are used for forming logic devices, but the logic devices formed in the second device region 300 have thicker gate oxide 120 to achieve lower leakage current and lower power consumption. The present disclosure discloses various methods to modulate (e.g., change) the thickness of the gate oxide in different device regions (e.g., 200 and 300) of the NSFET device 100.

FIGS. 3A, 3B, 4A, 4B, 5A-5C, 6A-6C, 7A-7C, 8A, 8B, 9A, 9B, 10A, 10B, 11A, 11B, 12A, 12B, 13A, 13B, 14A, 14B, 15A, 15B, 16A, 16B, 17A, 17B, 18A and 18B are cross-sectional views of the NSFET device 100 at subsequent stages of manufacturing, in accordance with an embodiment. FIGS. 3A, 4A, 5A, 6A, 7A, 8A, 9A, 10A, 11A, 12A, 13A, 14A, 15A, 16A, 17A, and 18A are cross-sectional views along cross-section B-B in FIG. 1. FIGS. 3B, 4B, 5C, 6C, 7C, 8B, 9B, 10B, 11B, 12B, 13B, 14B, 15B, 16B, 17B, and 18B are cross-sectional views along cross-section A-A in FIG. 1. FIGS. 5B, 6B, and 7B are cross-sectional views along cross-section D-D in FIG. 1. The number of fins and the number of gate structures illustrated in the figures are non-limiting examples, it should be appreciated that other numbers of fins and other numbers of gate structures may also be formed. Throughout the discussion herein, figures with the same numeral but different alphabets (e.g., FIGS. 10A and 10B) show cross-sectional views of the NSFET device at the same processing stage, but along different cross-sections.

Note that for simplicity, in some of the subsequent figures, when the processing is the same for both the first device region 200 and the second device region 300, the cross-sectional views (e.g., FIGS. 3A, 3B, 4A, 4B, 5A-5C, 6A-6C, 7A-7C, 8A, 8B) may be illustrated without specifying the device regions (e.g., 200 or 300). In addition, FIGS. 9A, 10A, 11A, 12A, 13A, 14A, 15A, 16A, 17A, and 18A are cross-sectional views along cross-section B-B of a fin in the first device region 200, the corresponding cross-sectional views along cross-section B-B of a fin in the second device region 300 are either the same or similar, with the differences (if any) between the first device region 200 and the second device region 300 described in the present disclosure.

Referring now to FIGS. 3A and 3B, fin structures 91 are formed protruding above the substrate 50. Each of the fin structures 91 includes a fin 90 and a layer stack overlying the fin 90. The layer stack 92 and the fin 90 may be formed by etching trenches in the multi-layer stack 64 and the substrate 50, respectively. The layer stack and the fin 90 may be formed by a same etching process.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structures 91.

In some embodiments, the remaining spacers are used to pattern a mask 94, which is then used to pattern the fin structure 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stack 92, and the patterned substrate 50 forms the fin 90, as illustrated in FIGS. 3A and 3B. Therefore, in the illustrated embodiment, the layer stack 92 also includes alternating layers of the first semiconductor material 52 and the second semiconductor material 54, and the fin 90 is formed of a same material (e.g., silicon) as the substrate 50.

Figure 4B:
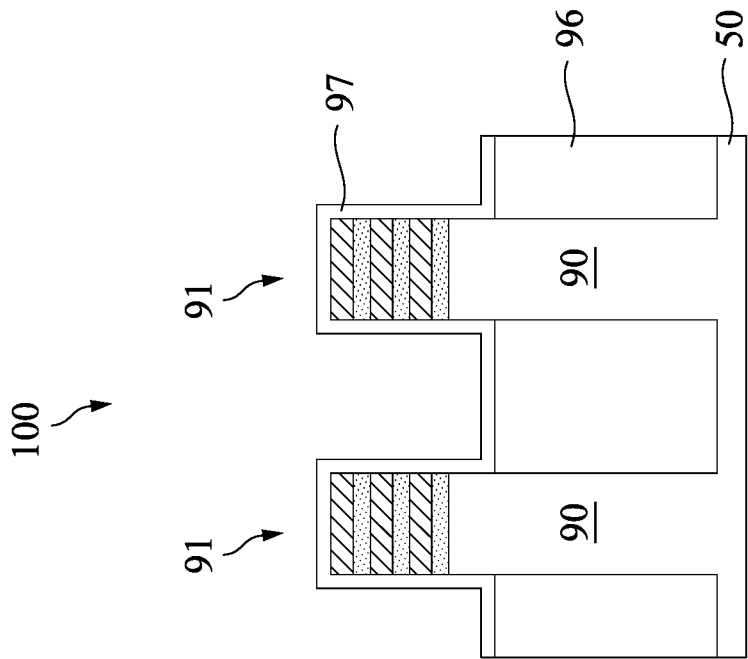
Figure 4A:
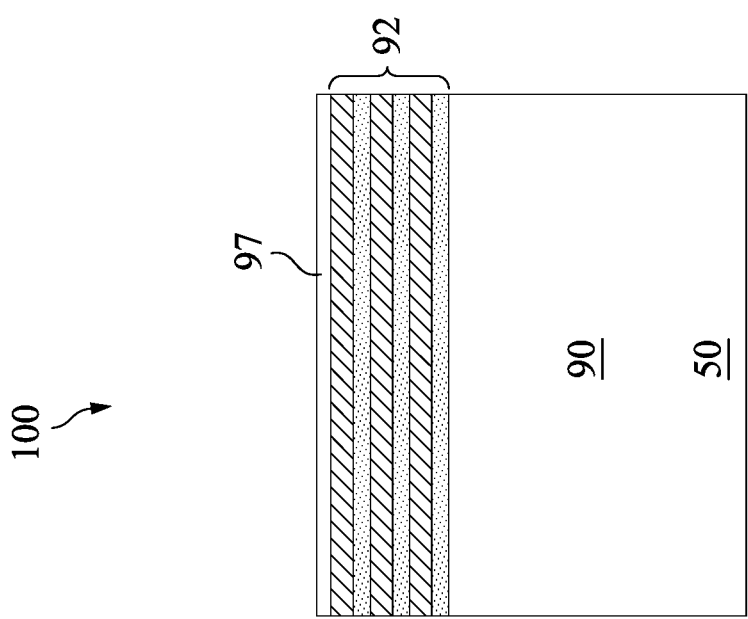

Next, in FIGS. 4A and 4B, Shallow Trench Isolation (STI) regions 96 are formed over the substrate 50 and on opposing sides of the fin structures 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the fins 90 and the layer stack 92). For example, a chemical oxide removal with a suitable etchant such as dilute hydrofluoric (dHF) acid may be used.

Still referring to FIGS. 4A and 4B, a dummy gate dielectric 97 is formed over the layer stack 92 and over the STI regions 96. The dummy gate dielectric 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidation process is performed to convert the deposited silicon layer into an oxide layer as the dummy gate dielectric 97.

Next, in FIGS. 5A-5C, dummy gates 102 are formed over the fin structures 91. To form the dummy gates 102, a dummy gate layer may be formed over the dummy gate dielectric 97. The dummy gate layer may be deposited over the dummy gate dielectric 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the layer stacks 92. The pattern of the masks 104 may be used to physically separate each of the dummy gates 102 from adjacent dummy gates. The dummy gates 102 may also have a lengthwise direction substantially perpendicular to the lengthwise direction of the fin structures 91. The dummy gate 102 and the dummy gate dielectric 97 are collectively referred to as dummy gate structure, in some embodiments.

Next, a gate spacer layer 108 is formed by conformally depositing an insulating material over the layer stacks 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A along cross-sections E-E and F-F in FIG. 5A, respectively. The cross-sections E-E and F-F correspond to cross-sections D-D and A-A in FIG. 1, respectively.

Next, in FIGS. 6A-6C, the gate spacer layer 108 is etched by an anisotropic etching process to form gate spacers 108. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric 97) forming the gate spacers 108.

FIGS. 6B and 6C illustrate cross-sectional views of the NSFET device 100 in FIG. 6A along cross-sections E-E and F-F, respectively. In FIG. 6B, portions of the gate spacer layer 108 are illustrated between neighboring fins 90 on the upper surface of the STI regions 96. Those portions of the gate spacer layer 108 may be left because the anisotropic etching process discussed above may not completely remove the gate spacer layer 108 disposed between neighboring fins, due to the smaller distance between the neighboring fins 90. In other embodiments, the portions of the gate spacer layer 108 disposed on the upper surface of the STI regions 96 between neighboring fins 90 are completely removed by the anisotropic etching process to form the gate spacers 108.

After the formation of the gate spacers 108, implantation for lightly doped source/drain (LDD) regions (not shown) may be performed. Appropriate type (e.g., p-type or n-type) impurities may be implanted into the exposed layer stacks 92 and/or fins 90. The n-type impurities may be any suitable n-type impurities, such as phosphorus, arsenic, antimony, or the like, and the p-type impurities may be any suitable p-type impurities, such as boron, $BF_2$, indium, or the like. The lightly doped source/drain regions may have a concentration of impurities of from about $10^{15}$ cm$^{-3}$ to about $10^{16}$ cm$^{-3}$. An anneal process may be used to activate the implanted impurities.

Next, openings 110 (which may also be referred to as recesses) are formed in the layer stacks 92. The openings 110 may extend through the layer stacks 92 and into the fins 90. The openings 110 may be formed by any acceptable etching technique, using, e.g., the dummy gates 102 as an etching mask.

After the openings 110 are formed, a selective etching process is performed to recess end portions of the first semiconductor material 52 exposed by the openings 110 without substantially attacking the second semiconductor material 54. After the selective etching process, recesses are formed in the first semiconductor material 52, such that sidewalls of the first semiconductor material 52 are recessed from respective sidewalls of the second semiconductor material 54. Therefore, the recesses in the first semiconductor material 52 are also referred to as sidewall recesses.

Next, an inner spacer layer is formed (e.g., conformally) in the opening 110. The inner spacer layer also fills the sidewall recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the sidewall recesses in the first semiconductor material 52. The remaining portions of the inner spacer layers (e.g., portions disposed inside the sidewall recesses in the first semiconductor material 52) form the inner spacers 55. FIGS. 6B and 6C illustrate cross-sectional views of the NSFET device 100 in FIG. 6A along cross-sections E-E and F-F in FIG. 6A, respectively.

Next, in FIGS. 7A-7C, source/drain regions 112 are formed in the openings 110. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In some embodiments, the gate spacers are used to separate the epitaxial source/drain regions 112 from the dummy gates by an appropriate lateral distance so that the epitaxial source/drain regions 112 do not short out subsequently formed gates of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 90. In the illustrated embodiment, adjacent epitaxial source/drain regions 112 remain separated (see FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 7B and 7C illustrate cross-sectional views of the NSFET device 100 of FIG. 7A, but along cross-section E-E and F-F in FIG. 7A, respectively.

Figure 8B:
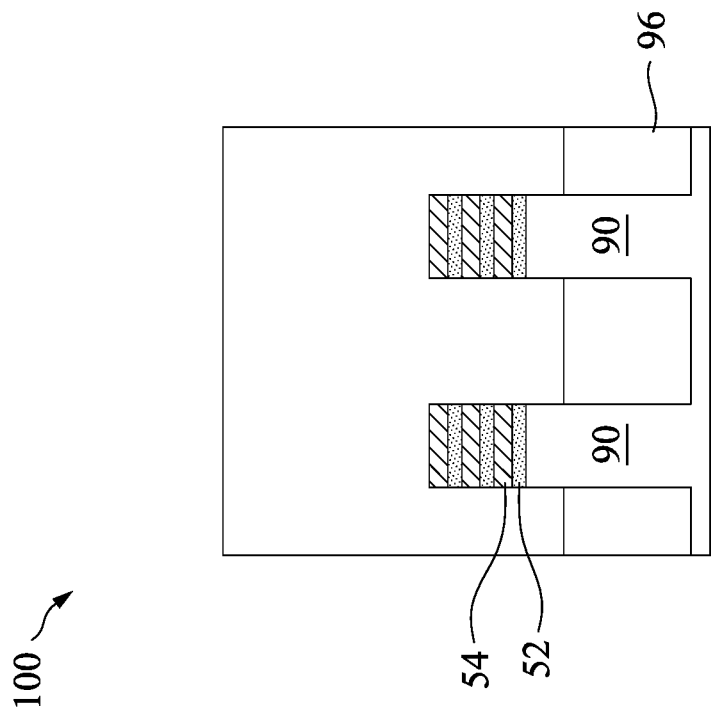
Figure 8A:
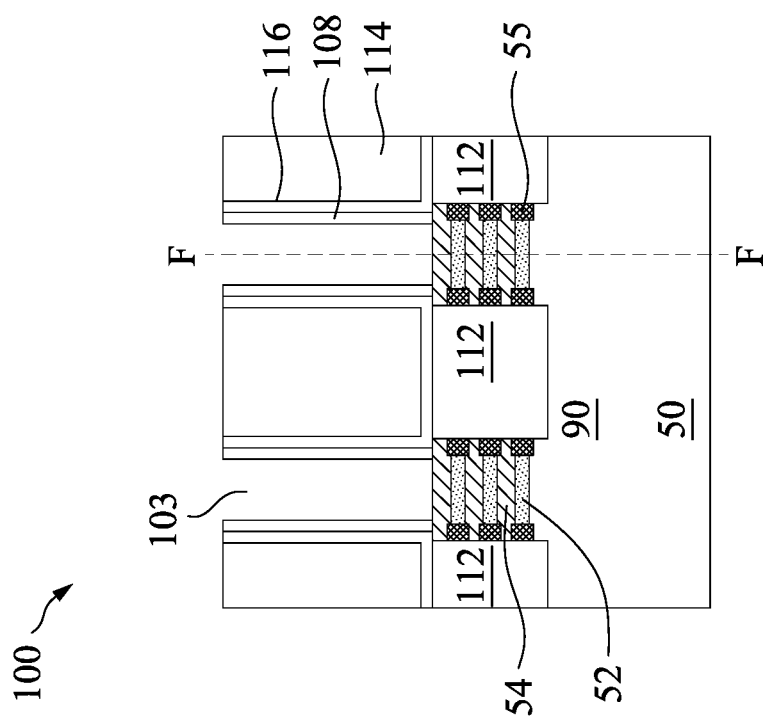

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates and gate spacers 108. The planarization process may also remove the masks 104 (see FIG. 7A) on the dummy gates 102, and remove portions of the gate spacers 108 and portions of the CESL 116 along sidewalls of the masks 104. After the planarization process, top surfaces of the dummy gates 102, gate spacers 108, CESL 116, and first ILD are level. Accordingly, the top surfaces of the dummy gates 102 are exposed through the first ILD 114.

Next, the dummy gates 102 are removed in an etching step(s), so that recesses 103 (also referred to as gate trenches) are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. An etching process, such as an isotropic etching process, may be performed to remove the dummy gate dielectric 97. In an embodiment, an isotropic etching process using an etching gas that comprises HF and $NH_3$ is performed to remove the dummy gate dielectric 97. FIG. 8B illustrates the cross-sectional view of the NSFET device 100 of FIG. 8A along the cross-section F-F.

Figure 9A:
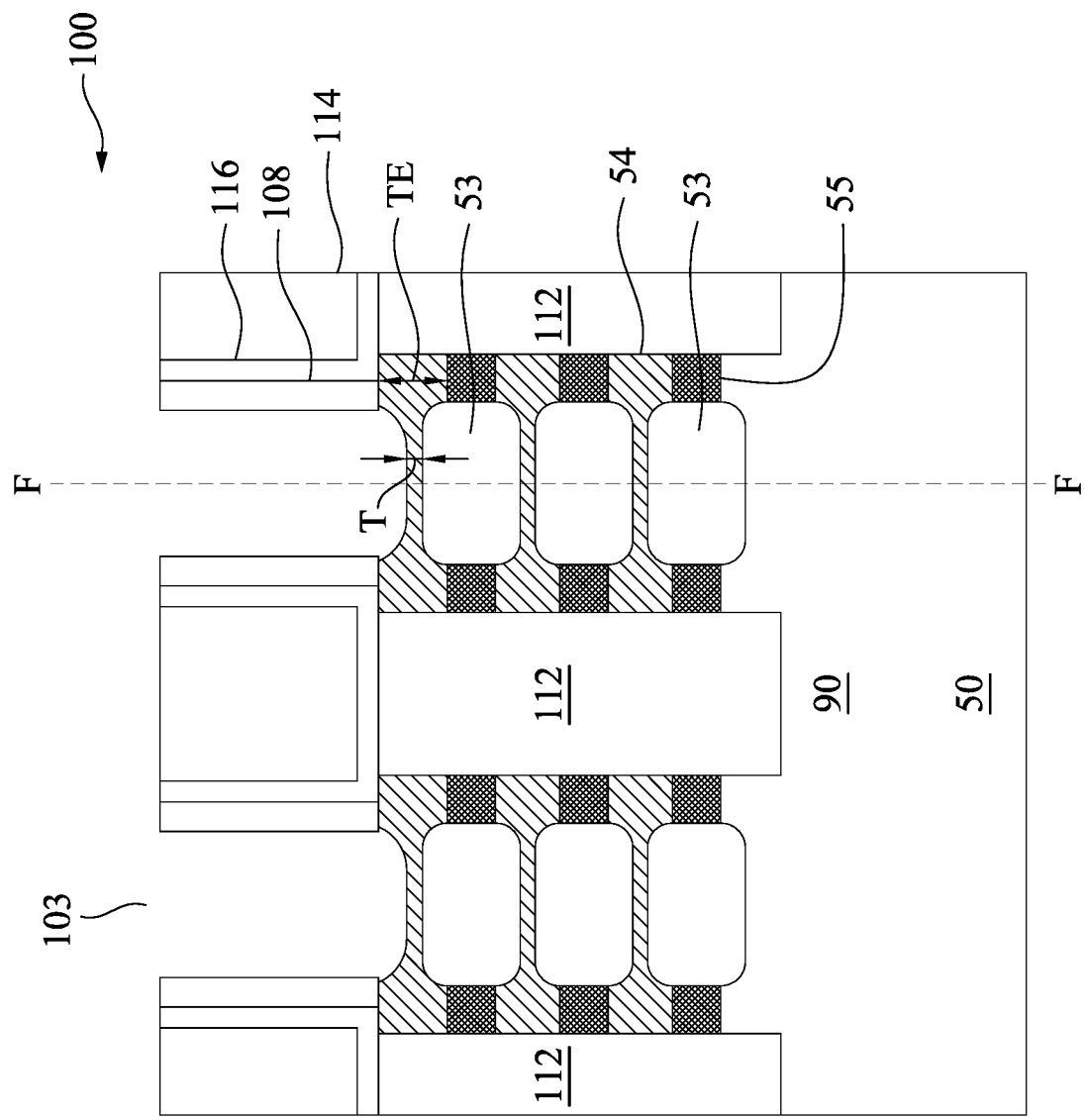
Figure 9B:
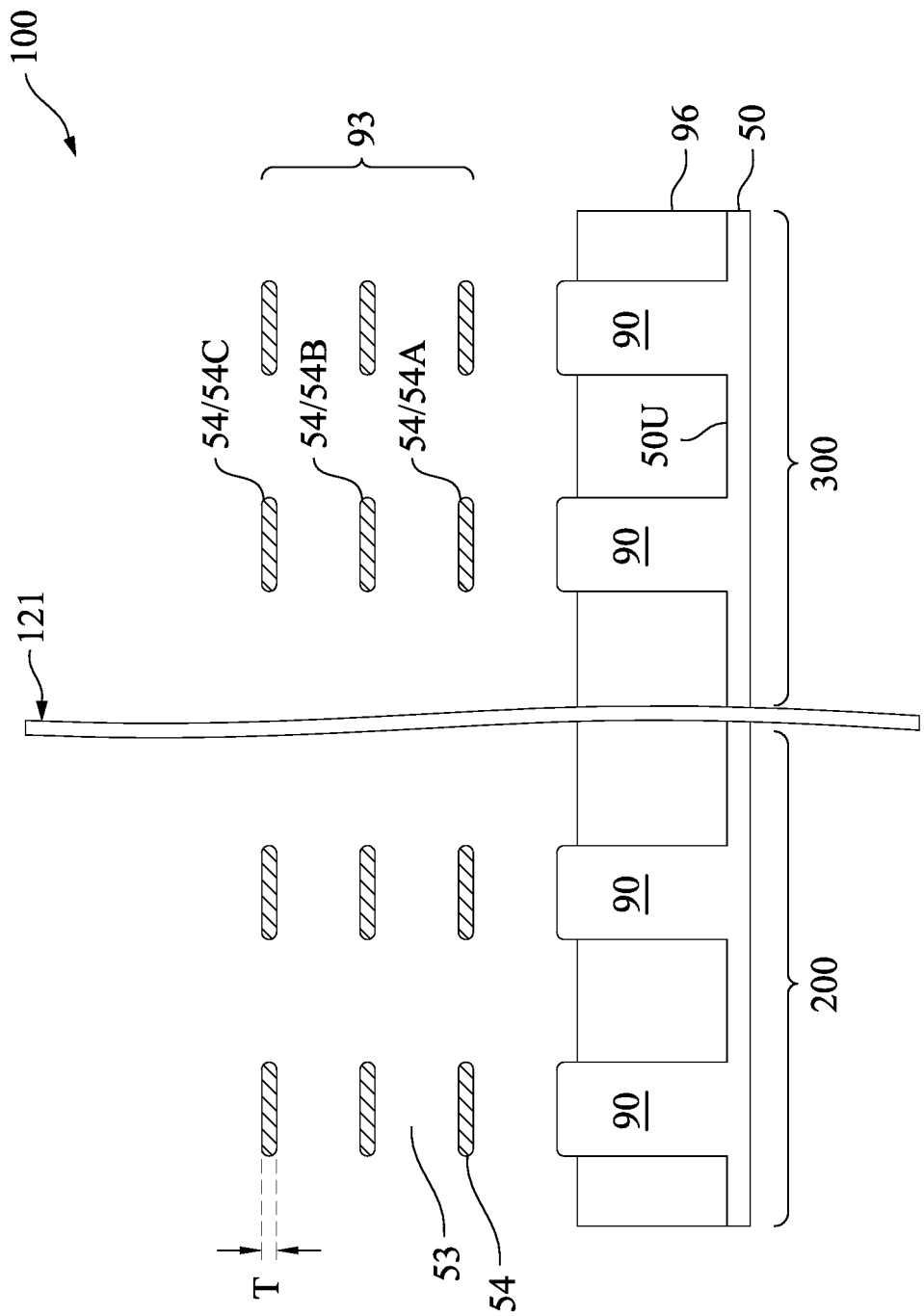

Next, in FIGS. 9A and 9B, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface 50U of the substrate 50). The nanostructures 54 may be collectively referred to as the channel regions 93 or the channel layers 93 of the NSFET device 100 formed. As illustrated in FIG. 9A, gaps 53 (e.g., empty spaces) are formed between the nanostructures 54 by the removal of the first semiconductor material 52. Gaps 53 are also formed between the lowermost nanostructures 54 and the top surface of the fins 90. In some embodiments, the nanostructures 54 are nanosheets or nanowires, depending on, e.g., the dimensions (e.g., size and/or aspect ratio) of the nanostructures 54.

In some embodiments, the first semiconductor material 52 is removed by a selective etching process using an etchant that is selective to (e.g., having a higher etch rate for) the first semiconductor material 52, such that the first semiconductor material is removed without substantially attacking the second semiconductor material 54. In some embodiments, an isotropic etching process is performed to remove the first semiconductor material 52. The isotropic etching process is performed using an etching gas, and optionally, a carrier gas, where the etching gas comprises $F_2$ and HF, and the carrier gas may be an inert gas such as Ar, He, $N_2$, combinations thereof, or the like. The isotropic etching process may include a first step to remove the first semiconductor material 52, and a second step after the first step to reshape the profile of the nanostructures 54.

FIG. 9A illustrates the cross-sectional view of the NSFET device 100 along a longitudinal axis of the fin 90 (e.g., along a current flow direction in the fin), and FIG. 9B illustrates the cross-sectional view of the NSFET device 100 along cross-section F-F, which is a cross-section along a direction perpendicular to the longitudinal axis of the fin 90 and across a middle portion of the nanostructure 54. Note that FIG. 9B illustrates the first device region 200 (e.g., a logic device region) and the second device region 300 (e.g., an I/O device region). As illustrated in FIG. 9B, each of the device regions (e.g., 200, 300) has a plurality of fins 90, and each fin 90 has a plurality of nanostructures 54 overlying (e.g., over and vertically aligned with) the fin 90. The first device region 200 and the second device region 300 may be immediately adjacent to each other, or may be separated from each other, as shown by divider 121 in FIG. 9B.

As illustrated in FIG. 9A, after the nanostructures 54 are formed, in the cross-section along the longitudinal axis of the fin 90, each of the nanostructures 54 has a dumbbell shape, where end portions of the nanostructure 54 (e.g., portions physically contacting the source/drain regions 112) have a height TE (measured along the vertical direction of FIG. 9A) larger than that a height T of the middle portion (e.g., a portion mid-way between the end portions) of the nanostructure 54. The difference between the height TE and the height T of a nanostructure 54 may be referred to as the sheet height gap of the nanostructure 54.

In some embodiments, the layers of the second semiconductor material 54 in the multi-layer stack 64 (see FIG. 2) are formed to have a substantially same thickness, thus at the processing stage of FIGS. 9A and 9B, all of the nanostructures 54 in the first device region 200 and the second device region 300 have substantially the same shape and dimensions (e.g., TE, T). In the example of FIGS. 9A and 9B, the upper surface and the lower surface of the middle portion of each nanostructure 54 are illustrated as level surfaces (e.g., flat surfaces). This is, of course, merely a non-limiting example. In some embodiments, the upper surface and lower surface of the middle portion of each nanostructure 54 are curved, such as curved toward a horizontal center axis of the nanostructure 54. In addition, in the cross-section of FIG. 9B, each of the nanostructures 54 has a stadium shape (may also be referred to as a racetrack shape, a discorectangle shape, an obround shape, or a sausage body shape). In the cross-section of FIG. 9B, the corners of each nanostructure 54 are rounded (e.g., curved). In some embodiments, at the processing stage of FIGS. 9A and 9B, the height T is between about 3 nm and about 20 nm, the height TE is between about 3 nm and about 35 nm, and the difference between TE and T (e.g., the sheet height gap) is between about 0 nm and about 15 nm.

As feature sizes continue to shrink in advanced processing nodes, the distance between adjacent nanostructures 54 may become so small that it may be difficult to form layers (e.g., gate dielectric layer) around the nanostructures 54 in subsequent processing. By forming dumbbell-shaped nanostructures 54, the distance between adjacent nanostructures 54 is increased, thus making it easier to form, e.g., gate dielectric layer 122 (see FIGS. 11A and 11B) around the nanostructures 54. In addition, since the height T of the nanostructures 54, which form the channel regions of the NSFET device 100, is reduced, it is easier to control (e.g., turning on or off) the NSFET device 100 by applying a gate control voltage on the metal gate formed in subsequent processing.

Figure 10A:
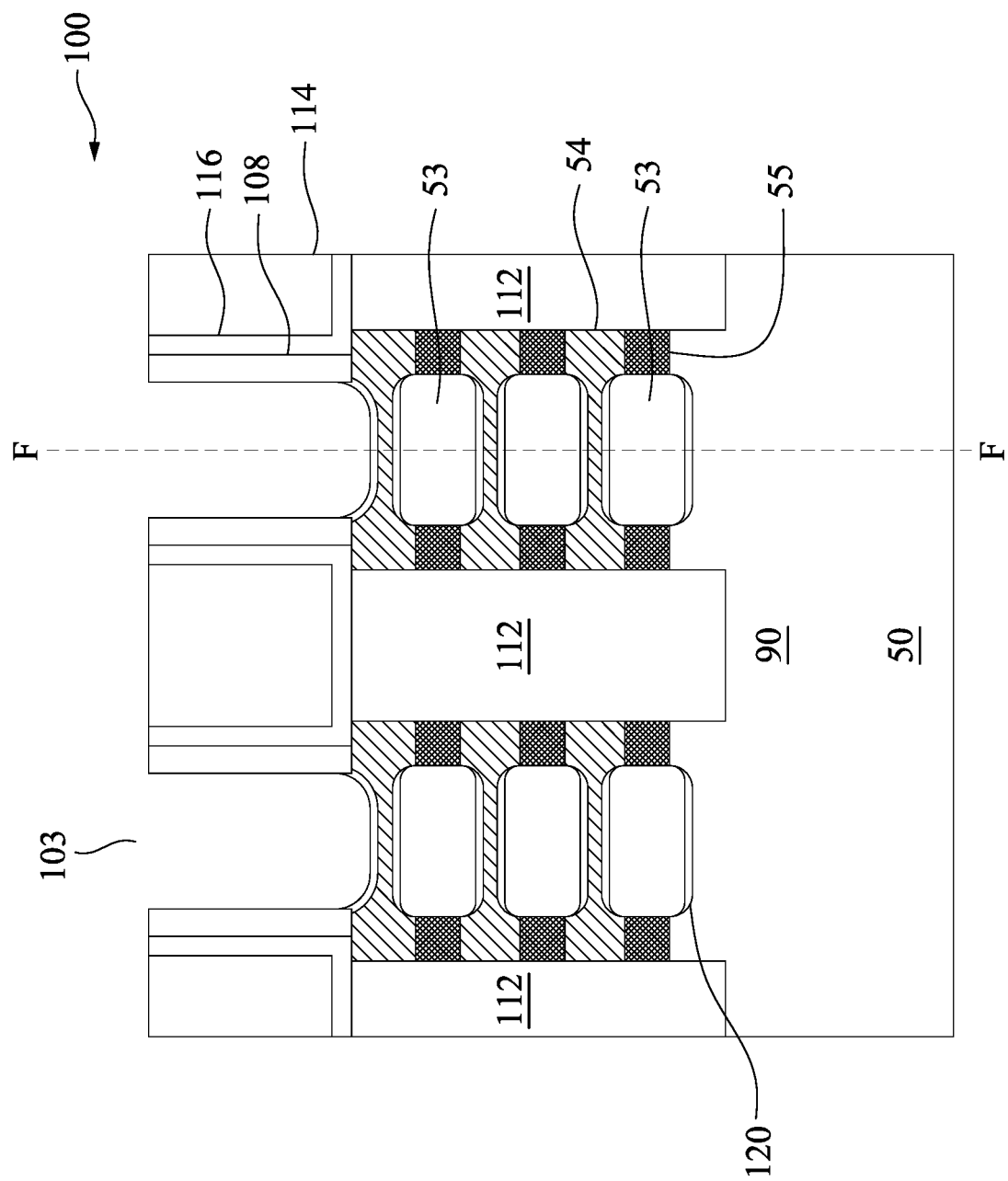
Figure 10B:
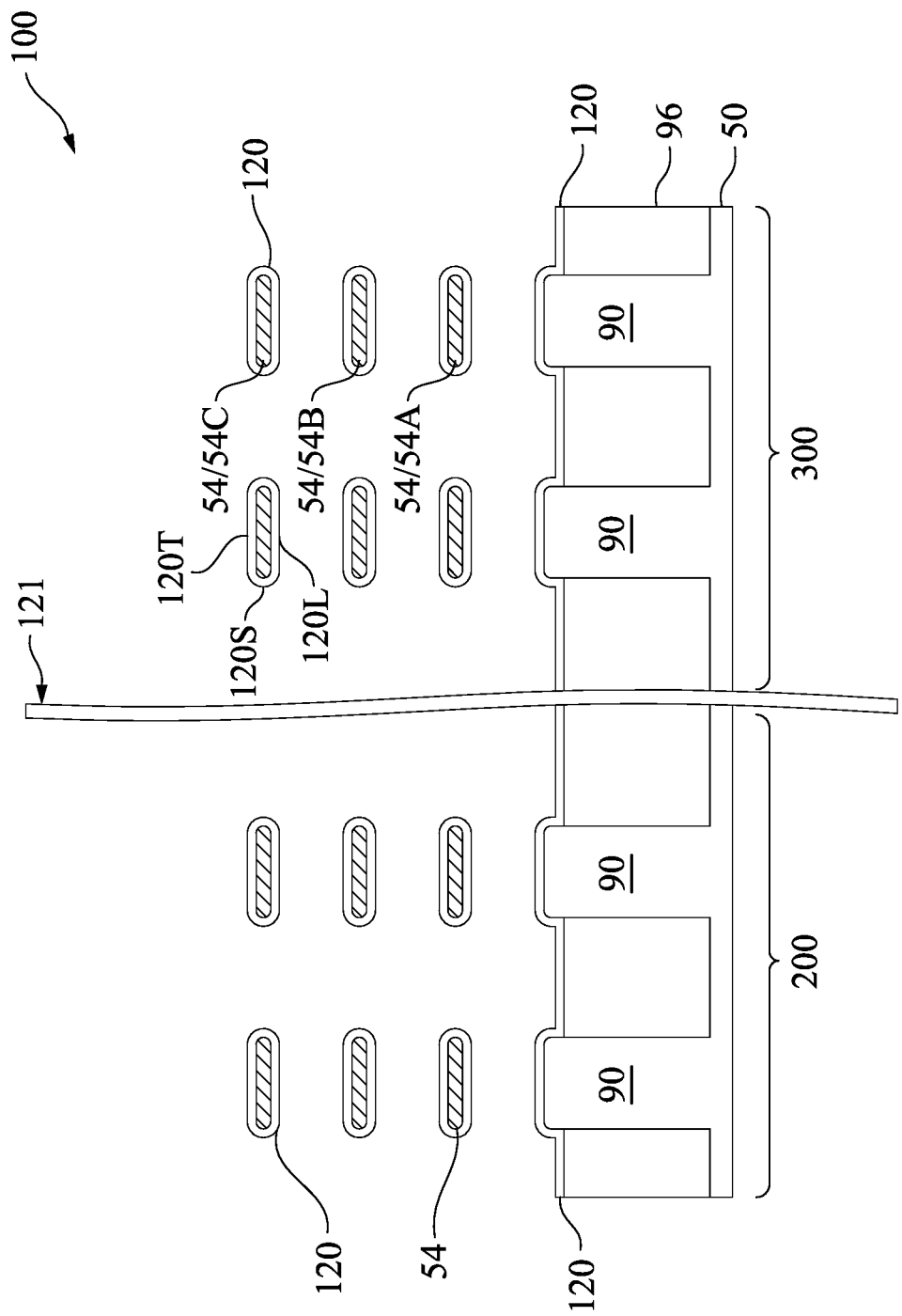

Next, in FIGS. 10A and 10B, an interfacial layer 120 is formed on surfaces of the nanostructures 54 that are exposed by the gaps 53 and the recesses 103. The interfacial layer 120 may also be formed on surfaces of the fins 90 exposed by the gaps 53. In some embodiments, the interfacial layer 120 is a dielectric material, and in particular, an oxide layer formed by oxidizing exterior portions (e.g., surface portions) of the nanostructures 54 (or the fins 90), thus may also be referred to as a gate oxide layer, an interfacial dielectric material, or a dielectric layer. In other words, the interfacial layer 120 is an oxide of the second semiconductor material 54, in some embodiments. Note that in the illustrated embodiment, the fins 90 and the second semiconductor material 54 comprise a same material (e.g., silicon), although the fins and the second semiconductor material 54 may comprise different materials in other embodiments. The interfacial layer 120 (e.g., an oxide layer) may be silicon oxide ($SiO_x$), silicon oxynitride ($SiO_xN_y$), silicon germanium oxynitride ($Si_xGe_{(1-z)}O_xN_y$), or the like.

In an embodiment, to form the interfacial layer 120, a chemical oxidization through a wet etch process is performed using an oxidizing agent such as SPM (a mixture of H2SO4 and H2O2), SC1 (a mixture of NH4OH and H2O2), or ozone-deionized water (a mixture of O3 and deionized water) to oxidize exterior portions of the nanostructures 54 and the fins 90. In another embodiment, to form the interfacial layer 120, a thermal oxidization is performed by treating (e.g., soaking) the nanostructures 54 and the fins 90 in an oxygen-containing gas source, where the oxygen-containing gas source includes, e.g., N2O, O2, a mixture of N2O and H2, or a mixture of O2 and H2, as examples. The thermal oxidization may be performed at a temperature between about 500° C. and about 1000° C. Note that in the illustrated embodiment, the interfacial layer 120 is formed by converting (e.g., oxidizing) the exterior portions of the nanostructure 54 and the fins 90 into an oxide, and therefore, the interfacial layer 120 is selectively formed on the exposed surfaces of the nanostructures 54 and the fins 90, and is not formed over other surfaces, such as the sidewalls of the inner spacers 55 and the gate spacers 108.

In some embodiments, at the processing stage of FIGS. 10A and 10B, the interfacial layer 120 around the nanostructures 54 is conformal and has a substantially same uniform thickness in both the first device region 200 and the second device region 300. For example, in FIG. 10B, the top portion 120T (e.g. a portion on a top surface of the nanostructure 54) of the interfacial layer 120, the bottom portion 120L (e.g., a portion on a bottom surface of the nanostructure 54) of the interfacial layer 120, and the sidewall portion 120S (e.g., a portion on a sidewall of the nanostructure 54) of the interfacial layer 120 have a substantially same thickness, wherein the thickness is measured along a direction perpendicular to the exterior surface of the nanostructure 54 at the location of measurement.

Figure 11A:
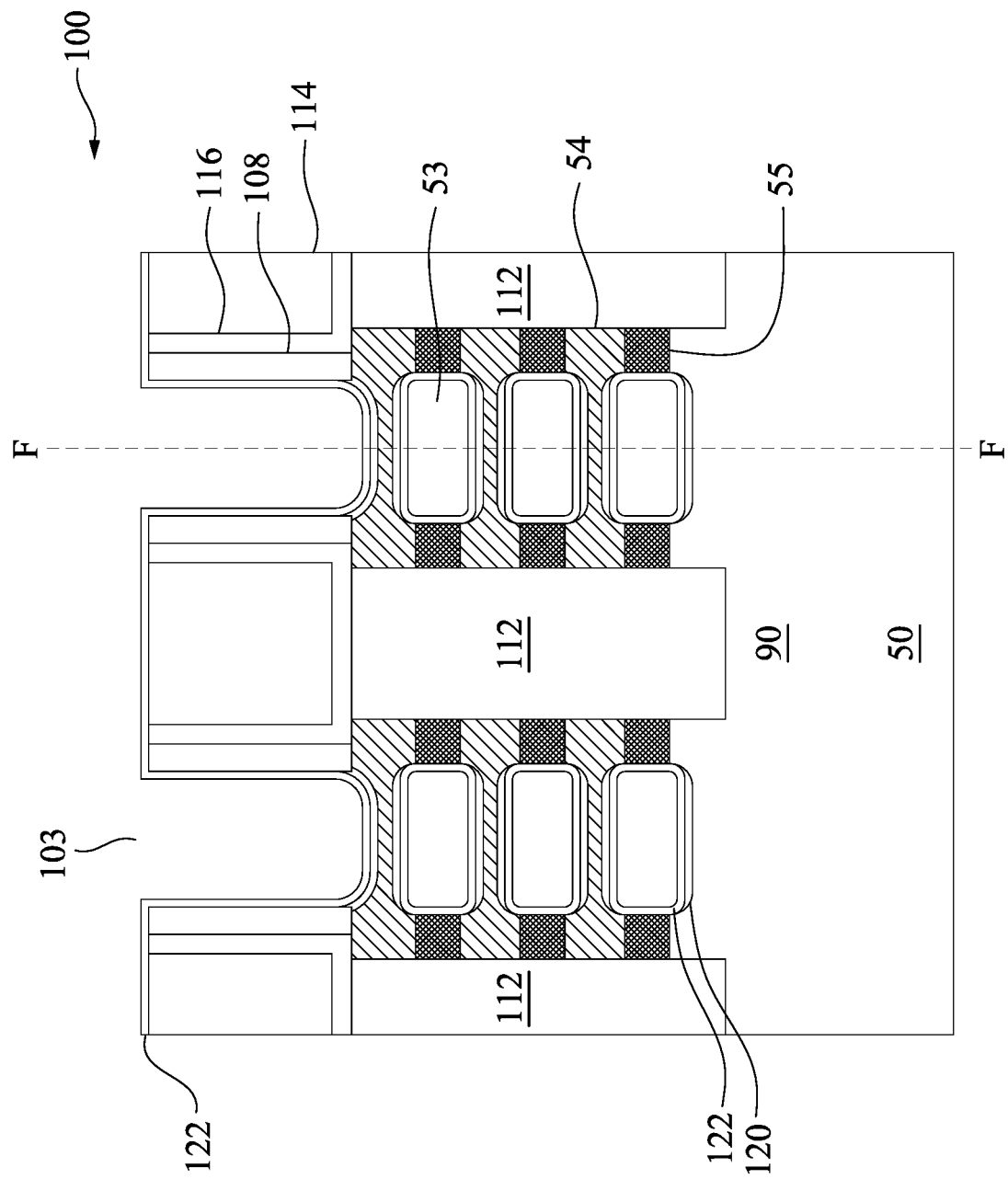
Figure 11B:
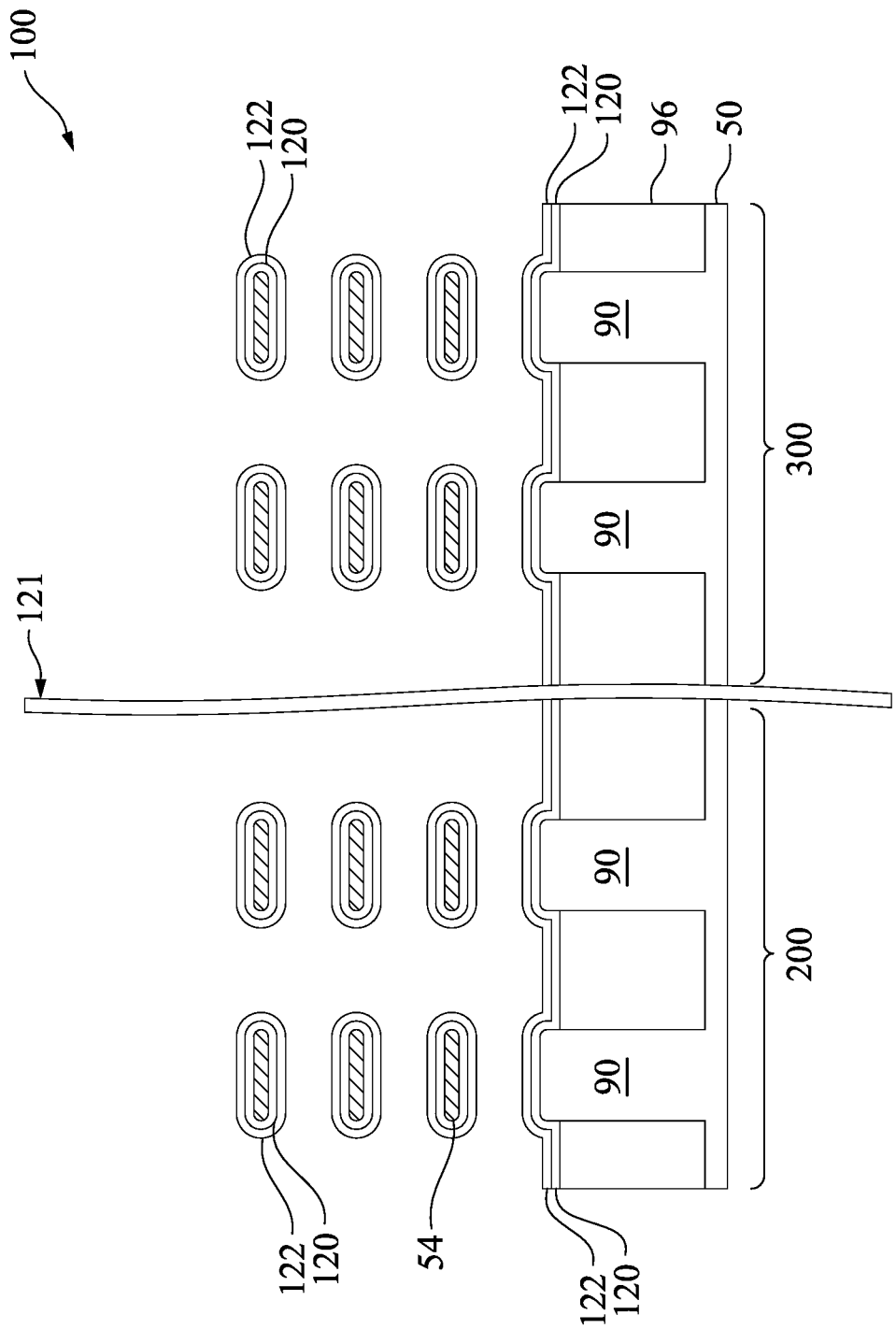

Next, in FIGS. 11A and 11B, a gate dielectric layer 122 is formed (e.g., conformally) on the interfacial layer 120 (e.g. around the nanostructures 54), along sidewalls of the gate spacers 108, and along the upper surface of the first ILD 114. In accordance with some embodiments, the gate dielectric layer 122 comprises silicon oxide, silicon nitride, or multi-layers thereof. In an example embodiment, the gate dielectric layer 122 includes a high-k dielectric material, and in these embodiments, the gate dielectric layer 122 may have a k value greater than about 7.0, and may include a metal oxide or a silicate of Hf, Al, Zr, La, Mg, Ba, Ti, or Pb, or combinations thereof. For example, the high-k dielectric material may be $HfO_2$, $ZrO_2$, HfZrO, HfTiO, HfLaO, HfAlO, HfZrO doped by La (La:HfZrO), HfZrO doped by Al (Al:HfZrO), or HfZrO doped by Ti (Ti:HfZrO). A thickness of the gate dielectric layer 122 may be between about 8 angstroms and about 50 angstroms. The formation methods of the gate dielectric layers may include Molecular-Beam Deposition (MBD), ALD, PECVD, and the like. In an embodiment, the gate dielectric layers 122 is formed by ALD at a temperature between about 200° C. and about 400° C.

Figure 12A:
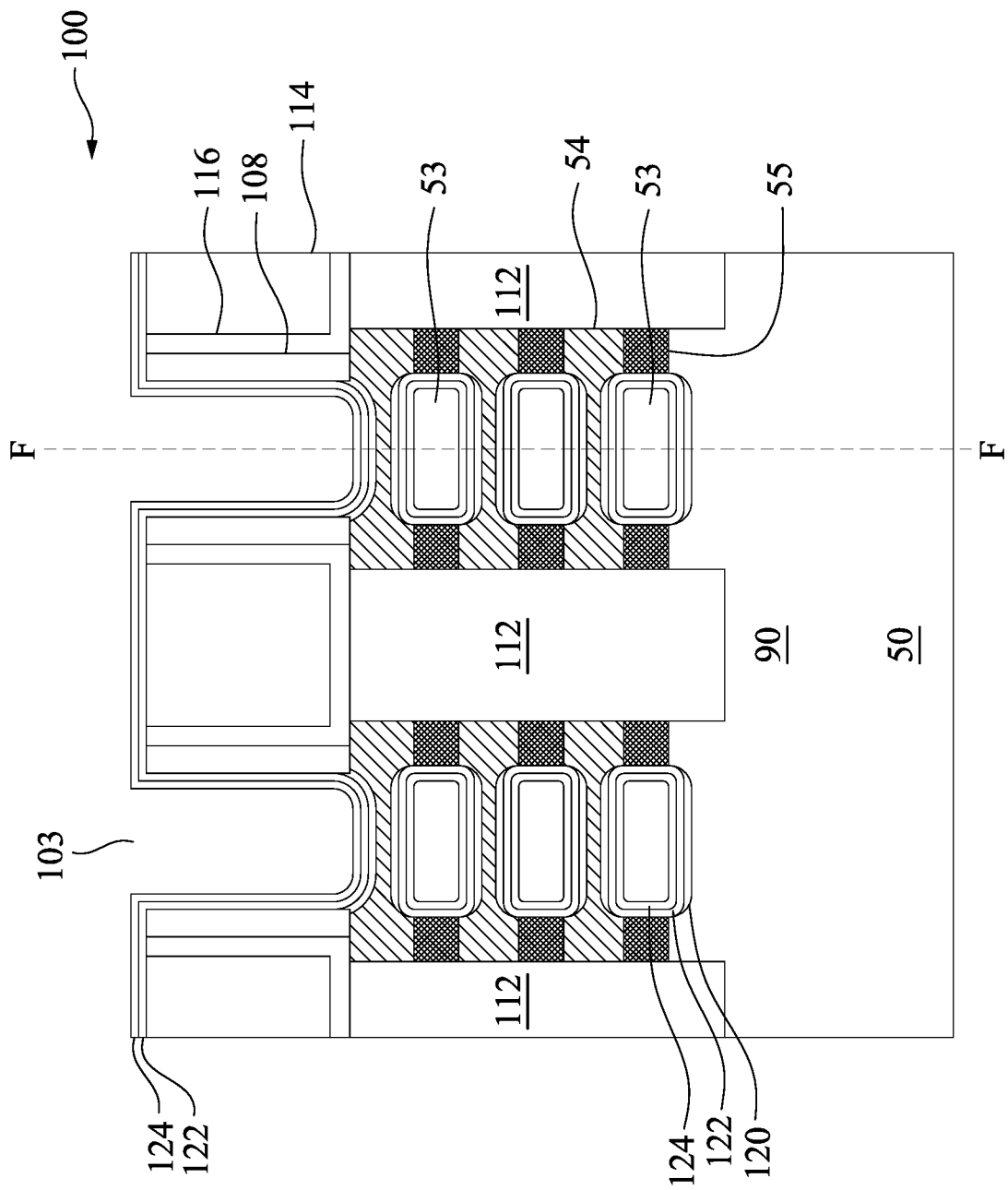
Figure 12B:
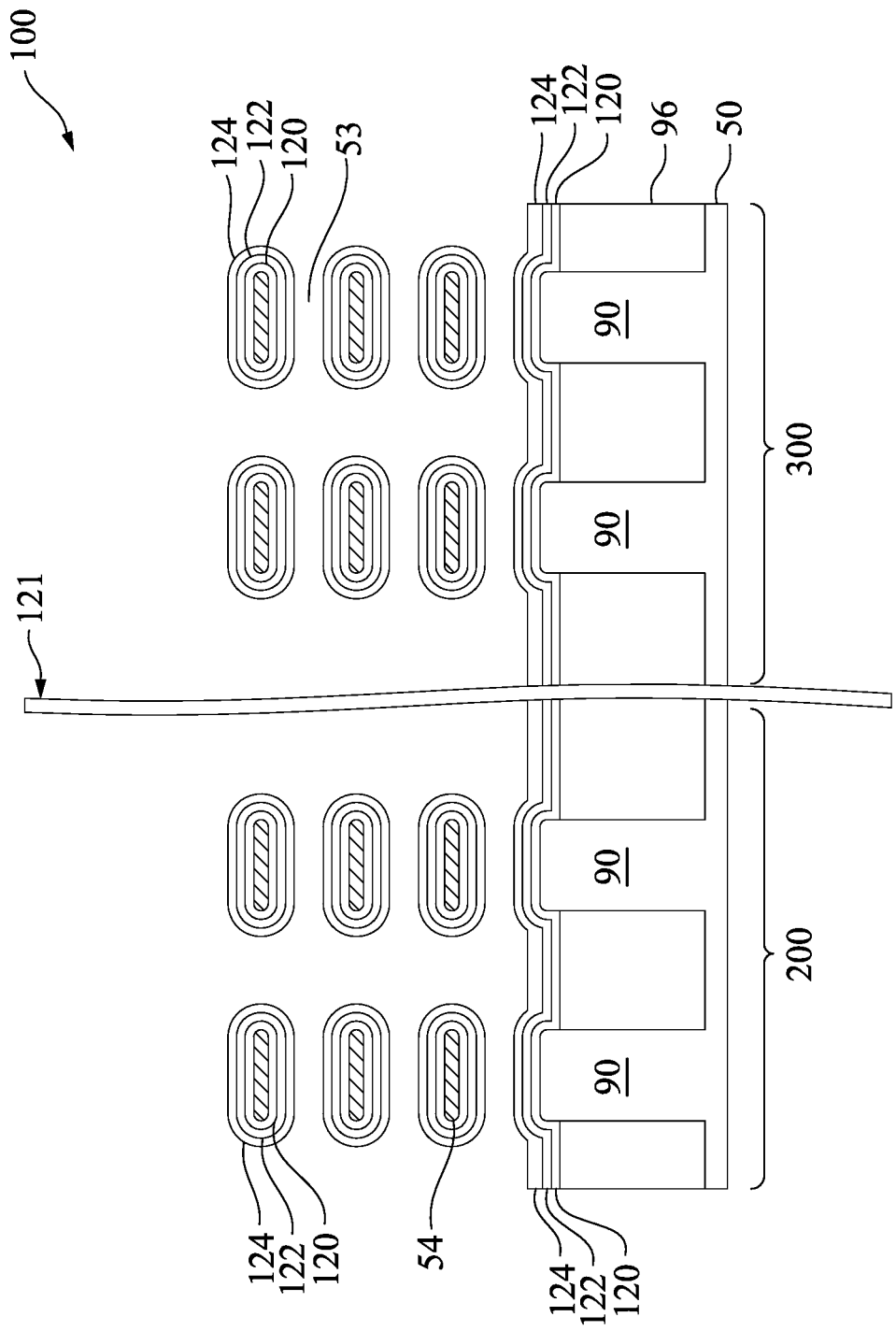

Next, in FIGS. 12A and 12B, a seed layer 124, which is optional, is formed (e.g., conformally) on the gate dielectric layer 122. The seed layer 124 is a dielectric film or a metal film (e.g., a metal-containing film), in some embodiments. In some embodiments, the dielectric film of the seed layer 124 is formed of $SiO_2$, high-k dielectric material such as $TiO_2$, $Al_2O_3$, $La_2O_3$, $Ga_2O_3$, $In_2O_3$, ZnO, $Nb_2O_5$, MgO, or $Ta_2O_5$, or the like. In some embodiments, the metal film of the seed layer 124 is formed of TiN, TiSiN, AlN, TiAlN, TaN, or the like. The seed layer 124 may be formed by, e.g., ALD or CVD. A thickness of the seed layer 124 may be between about 0 angstrom and about 30 angstroms. In some embodiments, the seed layer 124 is omitted. In some embodiments, the seed layer 124 helps to modulate the oxidization behavior and control the thickness of the interfacial layer 120, e.g., at upper surfaces of the nanostructures 54 during a subsequent oxidization process. In addition, the seed layer may improve thickness uniformity for the interfacial layer 120 at different vertical levels during the subsequent oxidization process.

Figure 13A:
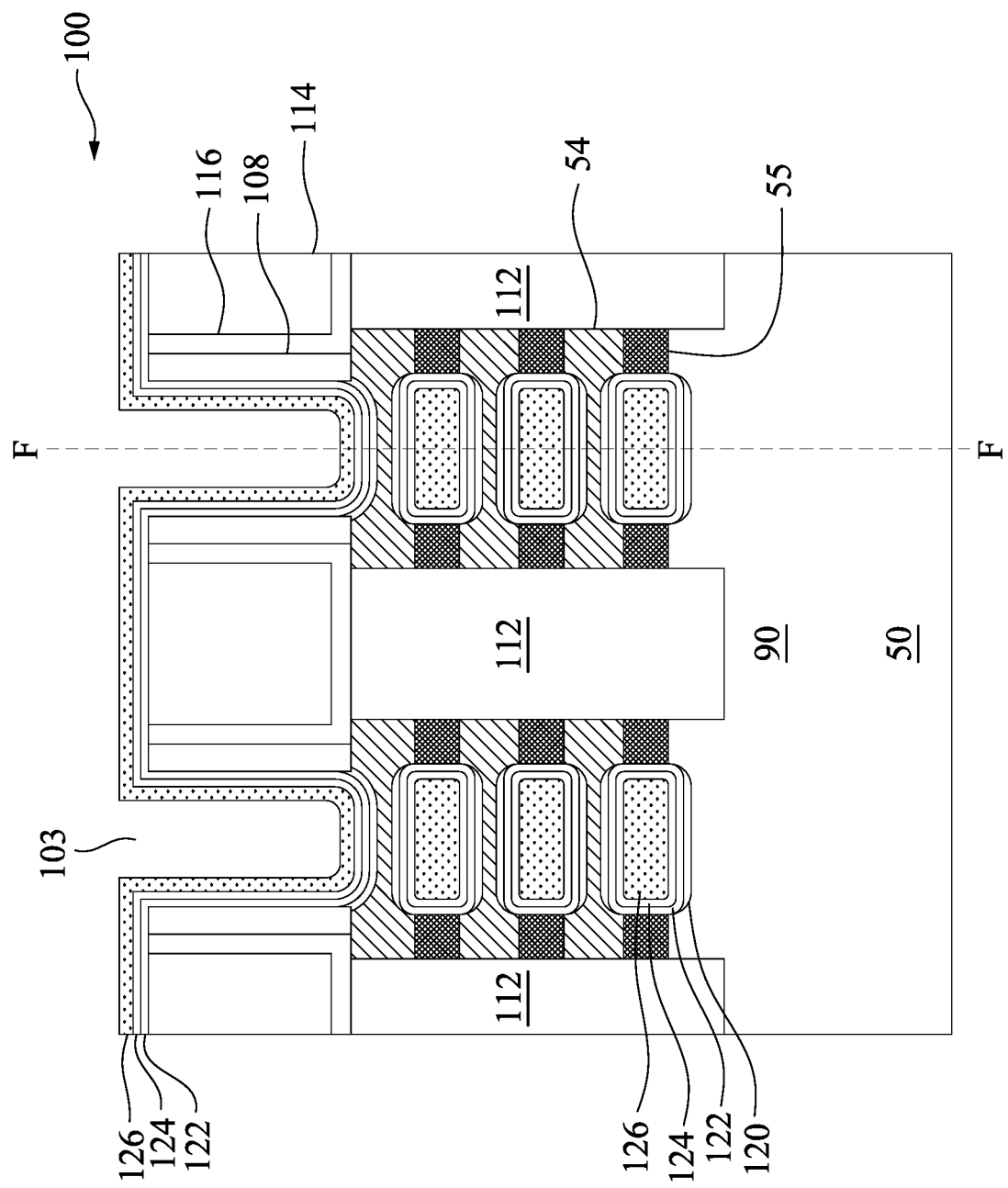
Figure 13B:
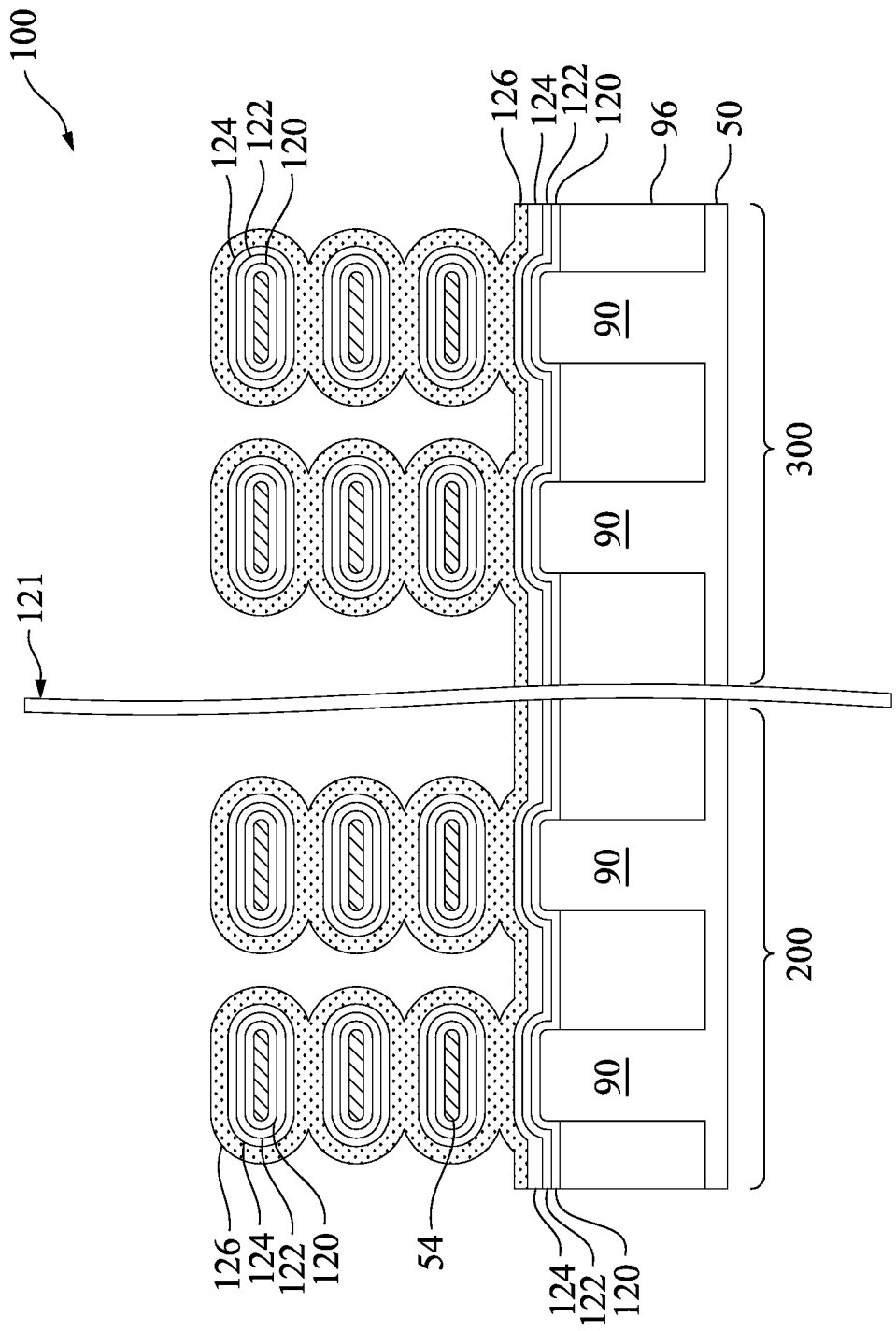

Next, in FIGS. 13A and 13B, a first hard mask layer 126 is formed on the seed layer 124, or on the gate dielectric layer 122 if the seed layer 124 is omitted. The first hard mask layer 126 is patterned subsequently to form a patterned hard mask layer to shield the first device region 200 from a subsequent oxidization process. The first hard mask layer 126 may be formed of a dielectric material, a metal material, or silicon. Examples dielectric materials for the first hard mask layer 126 include $TiO_2$, $Al_2O_3$, $La_2O_3$, $Ga_2O_3$, $In_2O_3$, ZnO, $Nb_2O_5$, MgO and $Ta_2O_5$. Examples metal materials for the first hard mask layer 126 include TiN, TiSiN, AlN and TiAlN. In some embodiments, the first hard mask layer 126 is formed of a same material as the seed layer 124. In other embodiments, the first hard mask layer 126 is formed of a different material than the seed layer 124. The first hard mask layer 126 may be formed by, e.g., ALD or CVD. In the example of FIGS. 13A and 13B, the first hard mask layer 126 fills (e.g., completely fills) the gaps 53 (see FIGS. 12A and 12B), and lines sidewalls and bottoms of the recesses 103. A thickness of the first hard mask layer 126 may be about angstroms or greater. The upper limit of the thickness of the first hard mask layer may depend on, e.g., the width of the recesses 103.

Figure 14A:
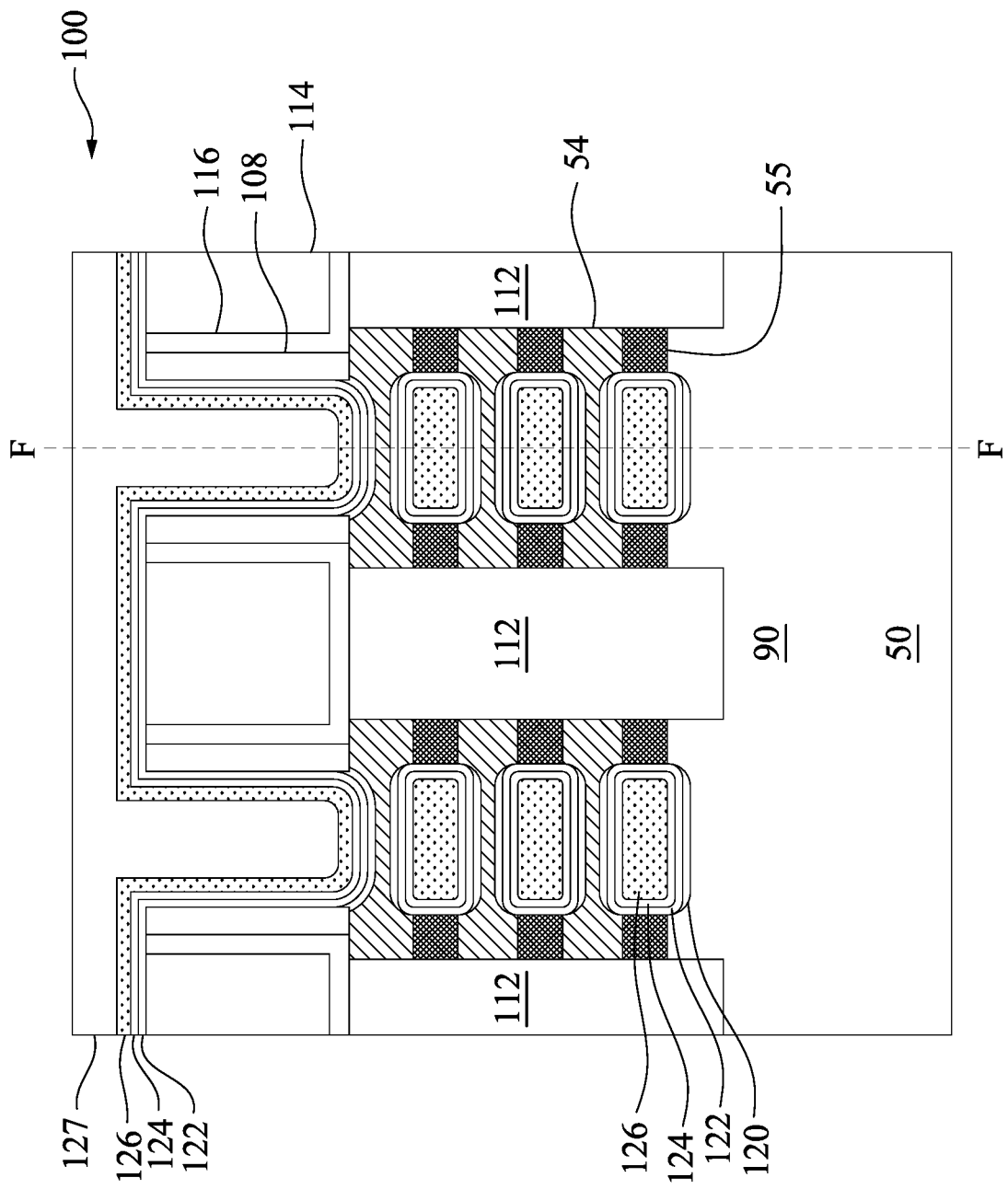
Figure 14B:
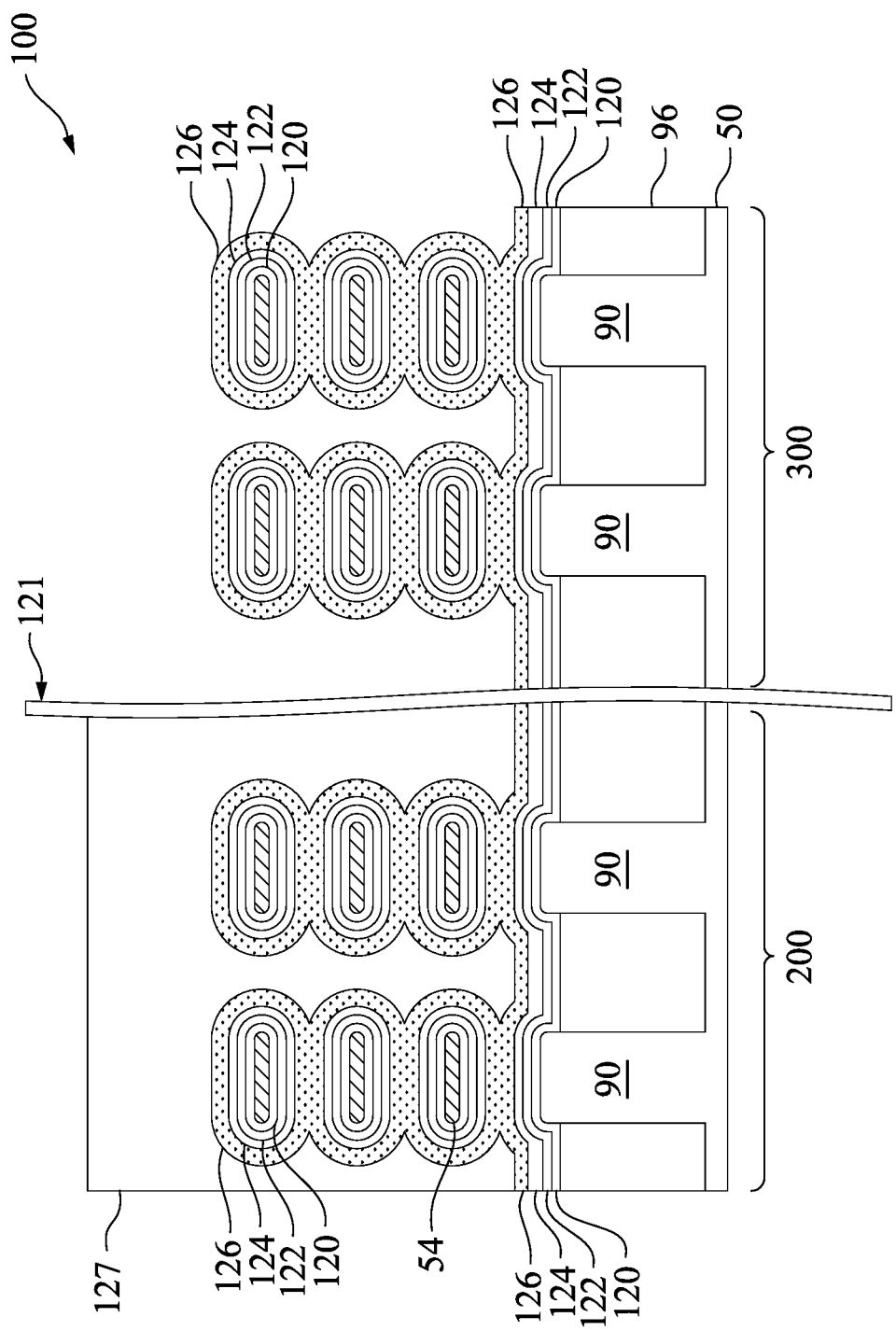

Next, in FIGS. 14A and 14B, a patterned mask layer 127 is formed to cover the first device region 200 and to expose the second device region 300. In some embodiments, the patterned mask layer 127 is formed by forming a photoresist layer over the first device region 200 and the second device region 300. The photoresist layer is then patterned, such that portions of the photoresist layer disposed over the second device region 300 is removed. As illustrated in FIG. 14B, the first hard mask layer 126 in the second device region 300 is exposed by the patterned mask layer 127, and the first hard mask layer 126 in the first device region 200 is covered by the patterned mask layer 127. Note that FIG. 14A illustrates the cross-section along a longitudinal axis of a fin 90 in the first device region 200, thus the patterned mask layer 127 covers the first hard mask layer 126. Although not shown, one skilled in the art will readily appreciate that the cross-section along a longitudinal axis of a fin 90 in the second device region 300 is similar to FIG. 14A, but without the patterned mask layer 127.

Figure 15A:
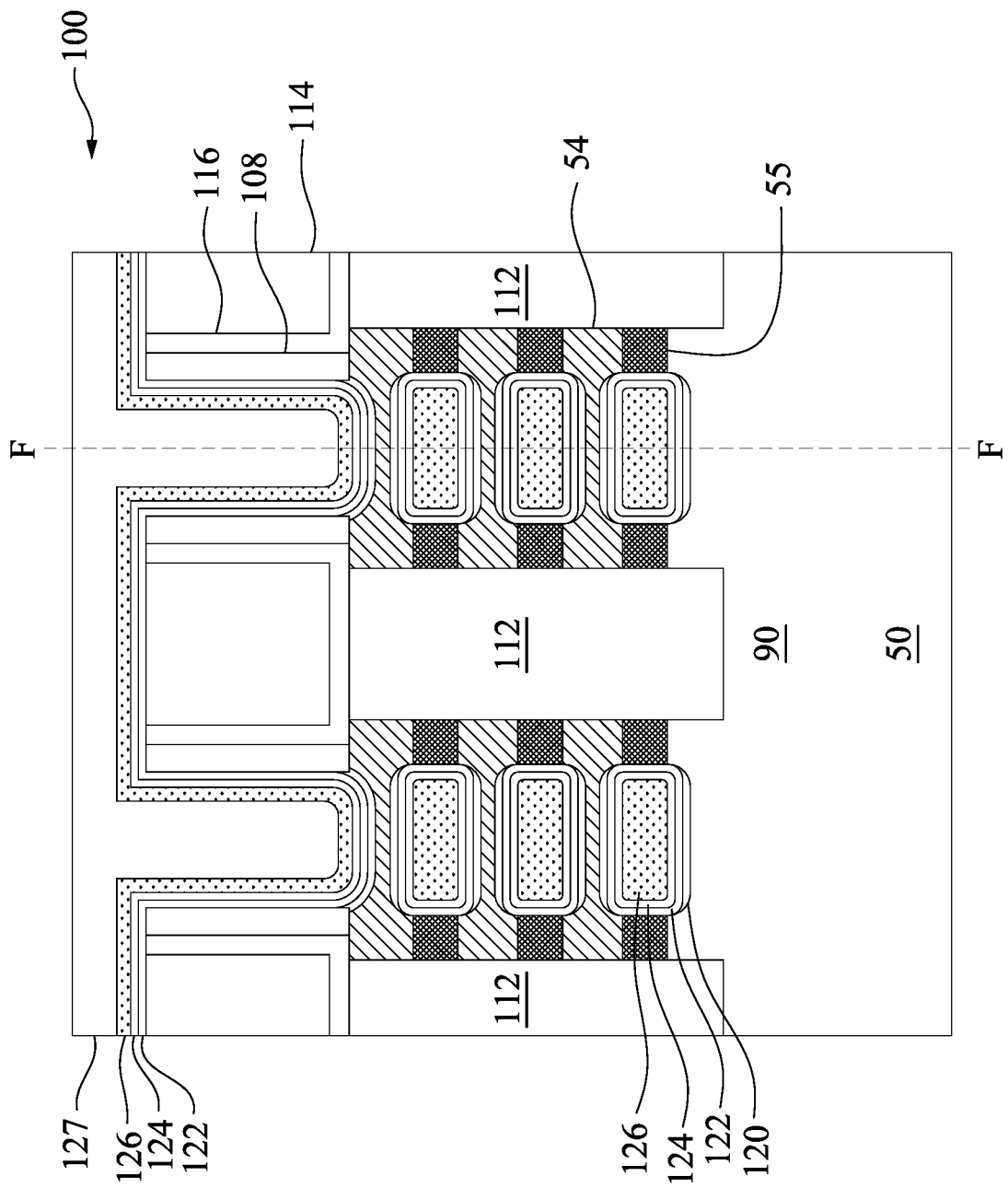
Figure 15B:
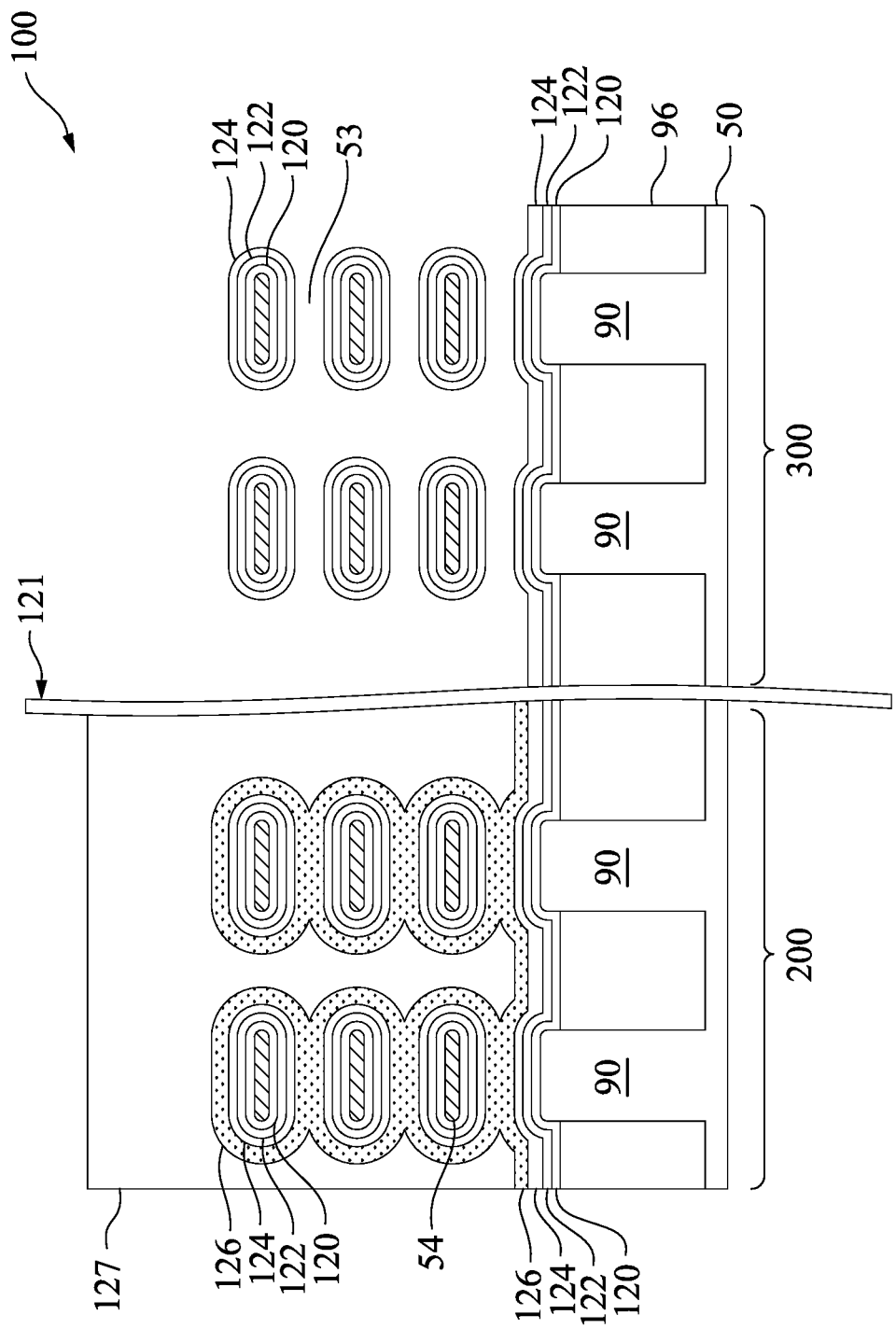

Next, in FIGS. 15A and 15B, the first hard mask layer 126 in the second device region 300 is removed. As illustrated in FIG. 15B, a suitable etching process may be performed to remove the exposed first hard mask layer 126 in the second device region 300, while the patterned mask layer 127 shields (e.g., protects) the first device region 200 from the etching process. The etching process may use an etchant that is selective to (e.g., having a higher etching rate for) the material of the first hard mask layer 126. After the first hard mask layer 126 is removed, the patterned mask layer 127 (e.g., a patterned photoresist layer) may be removed by a suitable process, such as ashing. Note that due to the removal of the first hard mask layer 126 in the second device region 300, there are gaps 53 between, e.g., adjacent nanostructures 54.

Figure 16A:
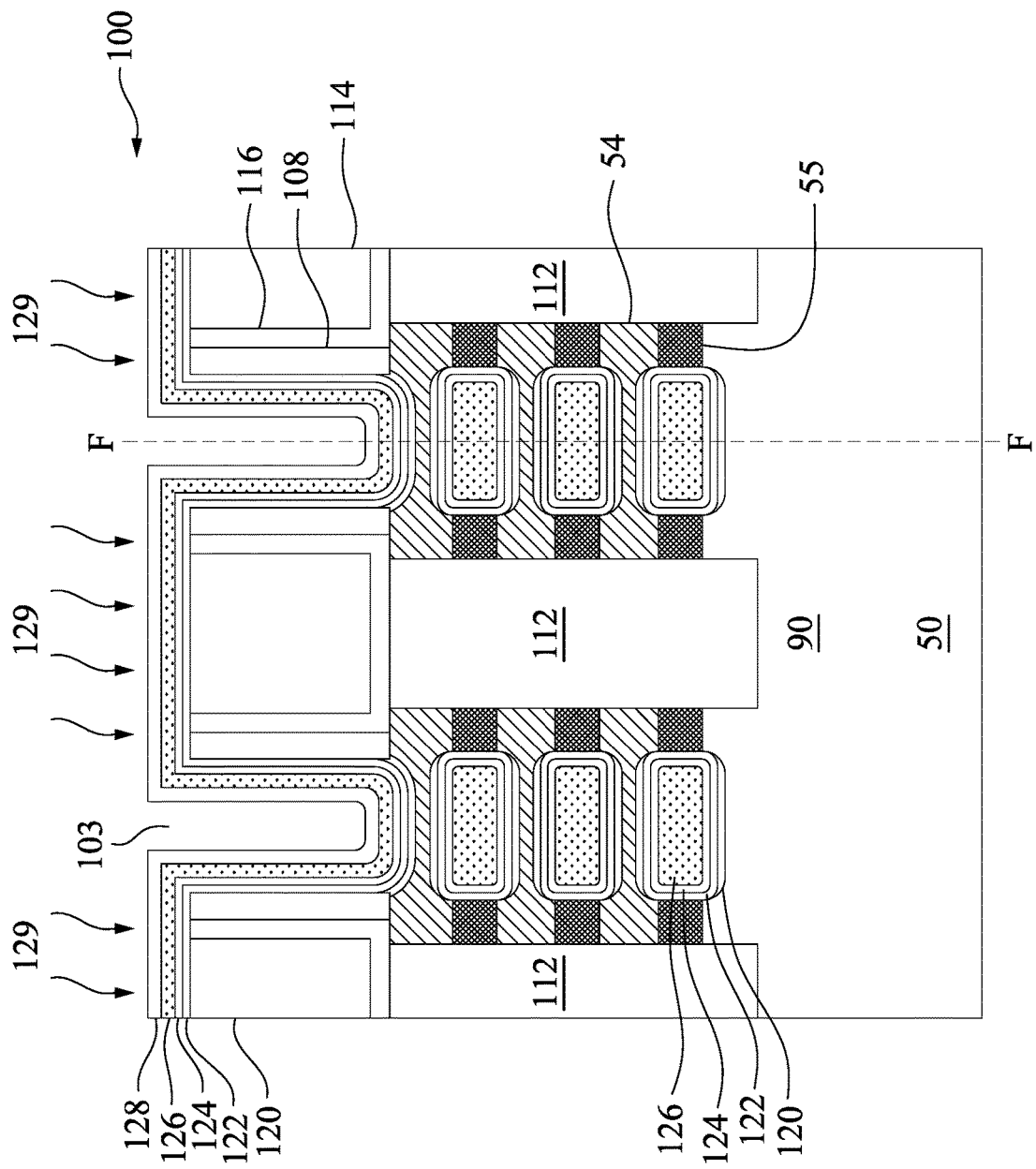
Figure 16B:
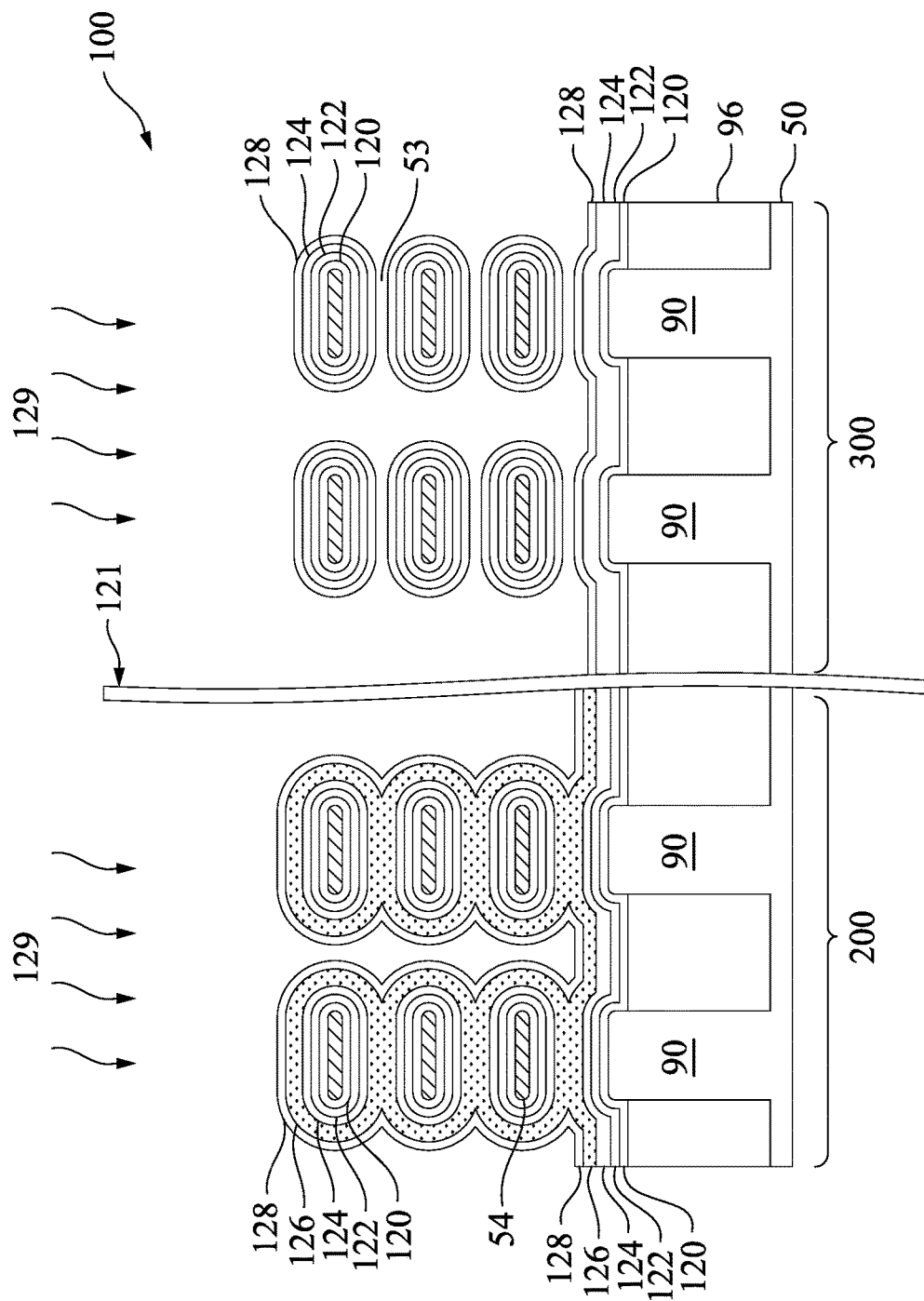

Next, in FIGS. 16A and 16B, a second hard mask layer 128, which is optional, is formed on the first hard mask layer 126 in the first device region 200 and is formed on the seed layer 124 (or on the gate dielectric layer 122 if the seed layer 124 is omitted) in the second device region 300. The second hard mask layer 128 may be formed of a dielectric material, a metal material, or silicon. The second hard mask layer 128 may be formed of a same or similar material as the first hard mask layer 126 using a same or similar formation method, thus details are not repeated. A thickness of the second hard mask layer 128 may be between about 0 angstroms and about 50 angstroms. In some embodiments, the second hard mask layer 128 is omitted.

In the illustrated embodiment of FIGS. 16A and 16B, in the first device region 200, the first hard mask layer 126 completely fills the gaps between nanostructures 54 and between the lowermost nanostructures 54 and the fins 90. Therefore, the second hard mask layer 128 extends along exterior surfaces of the first hard mask layer 126 around the nanostructures 54. In the second device region 300, the second hard mask layer 128 extends along exterior surfaces of the seed layer 124, or along exterior surfaces of the gate dielectric layer 122 if the seed layer 124 is not formed. Notably, in the cross-section view of FIG. 16B, the second hard mask layer in the second device region 300 encircles each nanostructure 54 completely (e.g., in a fully circle) and extends into the gaps 53.

Next, an oxidization process 129 is performed to increase the thickness of the interfacial layer 120 (e.g., gate oxide layer) around nanostructures 54. Due to the first device region 200 and the second device region 300 having different numbers of hard mask layers (which hard mask layers reduce the effect of the oxidization process on the nanostructures 54/interfacial layer 120), the effect of the oxidization process on the interfacial layer 120 are different in the first device region 200 and the second device region 300, which results in different thicknesses of the interfacial layer 120 in the first device region 200 and the second device region 300. Details are discussed below.

In some embodiments, the oxidization process is a plasma process (also referred to as a plasma oxidization process) performed by treating the NSFET device 100 (e.g., the nanostructures 54) using a plasma of an oxygen-containing gas source. The oxygen-containing gas source may be, e.g., oxygen gas (O2), nitrous oxide gas (N2O), a mixture of nitrous oxide gas (N2O) and nitrogen gas (N2), a mixture of oxygen gas (O2) and nitrogen gas (N2), a mixture of oxygen gas (O2) and an inert gas, or a mixture of nitrous oxide gas (N2O) and an inert gas, where the inert gas may be, e.g., argon (Ar) or helium (He). The oxygen-containing gas source may be ignited into a plasma by, e.g., a capacitively coupled plasma (CCP) system or an inductive coupled plasma (ICP) system, and the nanostructures 54 are then treated by the plasma. In some embodiments, a pressure of the plasma process is between about 1 mTorr to about 10 Torr, and a temperature of the plasma process is between room temperature and about 500° C. A duration of the plasma process is determined (e.g., adjusted) by requirements (e.g., thickness) of the interfacial layer 120, in some embodiments.

In some embodiments, the oxidization process is a thermal process (also referred to as a thermal oxidization process) performed by soaking the NSFET device (e.g., the nanostructures 54) in an oxygen-containing gas source. In an example embodiment, the oxygen-containing gas source is ozone (O$_3$) gas, and the ozone gas is supplied to be in contact with the NSFET device 100 for the thermal oxidization process. In some embodiments, a temperature of the thermal oxidization process is between room temperature and about 500° C. A duration of the plasma process is determined (e.g., adjusted) by requirements (e.g., thickness) of the interfacial layer 120, in some embodiments.

The oxidizing agent (e.g., plasma of the oxygen-containing gas source, or the oxygen-containing gas source) of the oxidization process penetrates or diffuses through the layers (e.g., 128, 124, 122, 120) around the nanostructures 54 in the second device region 300, and converts (e.g., oxidizes) exterior portions of the nanostructures 54 into an oxide of the material of the nanostructures 54, thereby increasing the thickness of the interfacial layer 120 in the second device region 300. Since the exterior portions of the nanostructures 54 in the second device region 300 are converted into an oxide, the height of the nanostructures 54 (e.g., the remaining un-oxidized portions of the semiconductor material of the nanostructure 54) in the second device region 300 is reduced, details of which are discussed below with reference to FIG. 17B.

Note that the nanostructures 54 in the first device region 200 are shielded (covered) by more (e.g., thicker) hard mask layers (e.g., 126 and 128) than the nanostructures 54 in the second device region 300, and therefore, the oxidizing agent of the oxidization process may not reach the nanostructures 54 in the first device region 200, or may be partially blocked by the hard mask layers. As a result, the thickness of the interfacial layer 120 around the nanostructures 54 in the first device region 200 may remain unchanged before and after the oxidization process, or may increase by a lesser amount than that of the interfacial layer 120 in the second device region 300. For embodiments where the second hard mask layer 128 is omitted, the different effects of the oxidization process on the interfacial layer 120 in the first device region 200 and the second device region 300 are similar to those discussed above, thus not repeated. In subsequent discussion, the interfacial layer 120 in the first device region 200 may also be referred to as interfacial layer 120A, and the interfacial layer in the second device region 300 may also be referred to as interfacial layer 120B.

Figure 17A:
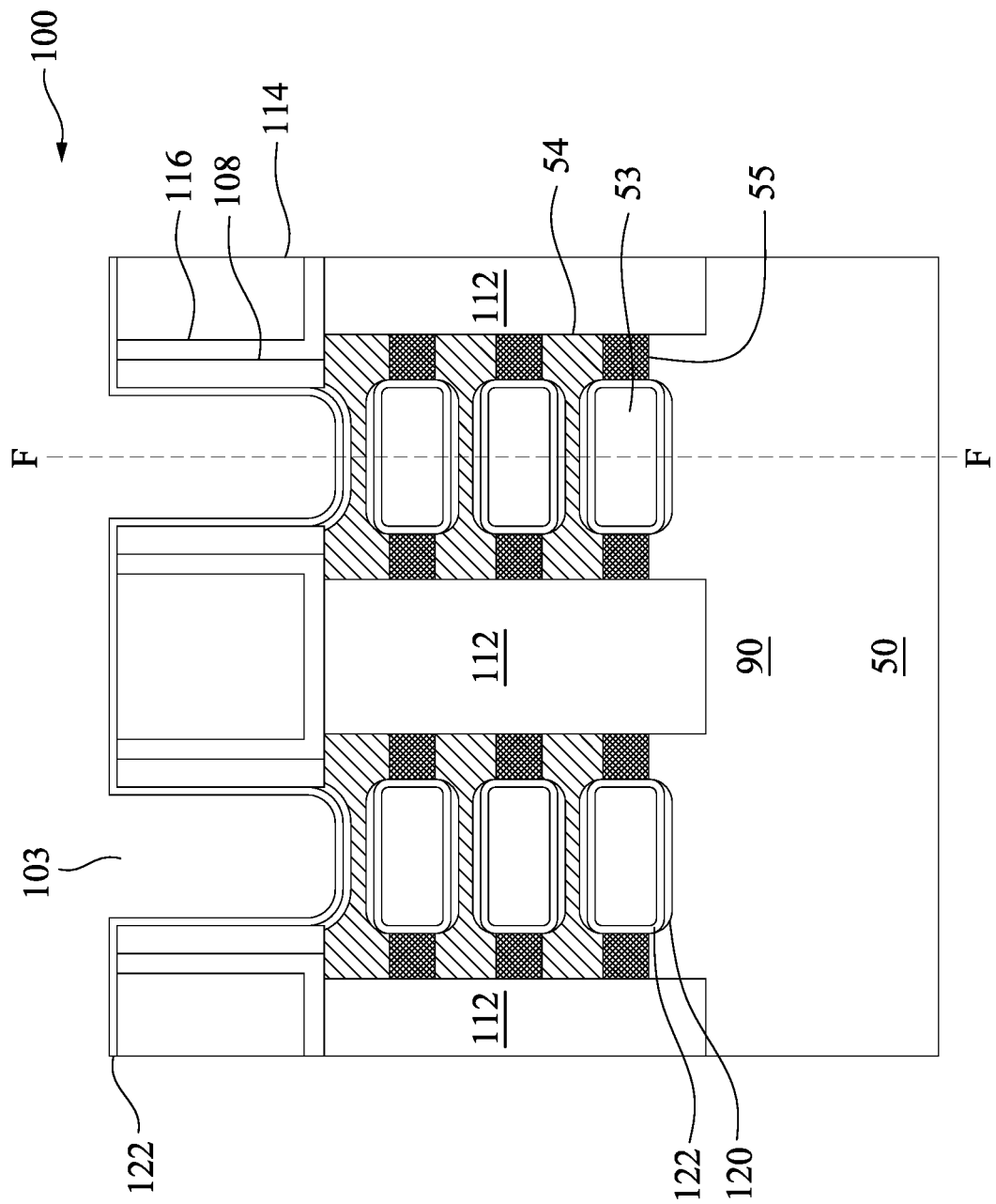
Figure 17B:
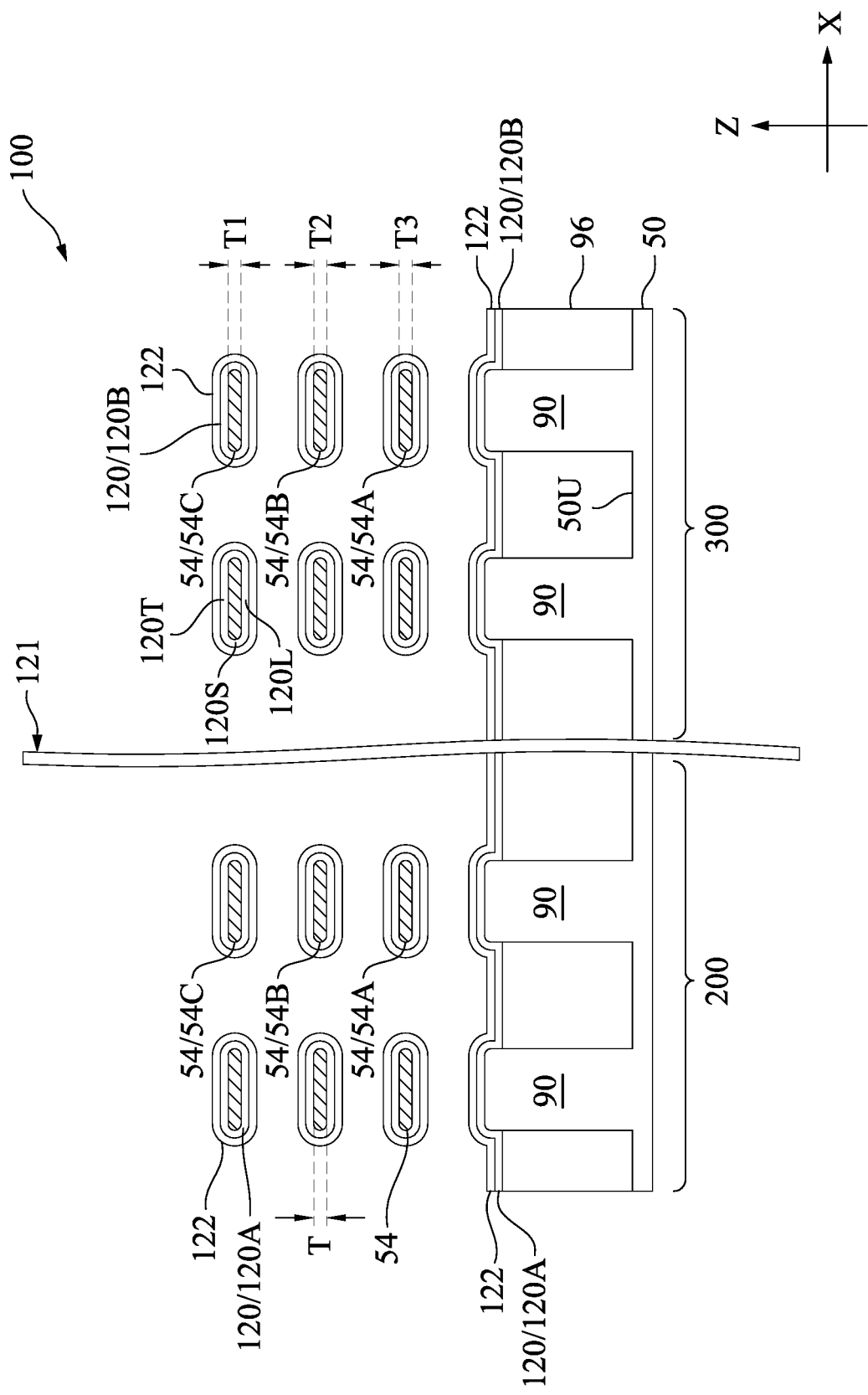

Next, in FIGS. 17A and 17B, after the oxidization process is finished, the second hard mask layer 128, the first hard mask layer 126, and the seed layer 124 are removed, and the gate dielectric layer 122 is exposed. In some embodiments, one or more etching processes may be performed to remove the second hard mask layer 128, the first hard mask layer 126, and the seed layer 124. The one or more etching process may be selective, such that the second hard mask layer 128, the first hard mask layer 126, and the seed layer 124 are removed without attacking other materials of the NSFET device 100, such as the nanostructures 54. In some embodiments, the etching process is performed using a suitable etchant such as SC1, SC2 (a mixture of HCl, $H_2O_2$, and deionized water), or dilute hydrofluoric (dHF) acid.

In FIG. 17B, the nanostructures 54 over the fins 90 are labeled as 54A, 54B, and 54C to distinguish the nanostructures 54 at different vertical levels (e.g., different distances from the major upper surface 50U of the substrate 50). As mentioned above, after the oxidization process, the heights of the nanostructures 54 in the second device region 300 are reduced. The heights of the nanostructures 54 in the first device region may remain unchanged, or may be reduced by a lesser amount than those in the second device region 300.

In some embodiments, the oxidization process has different effects on the thickness of the interfacial layer 120 (e.g., 120A, 120B) at different vertical levels. In an embodiment, the thickness (e.g., average thickness) of the interfacial layer 120B around the nanostructures 54 (e.g., 54A, 54B, and 54C) in the second device region 300 increases along the vertical direction Z in FIG. 17B, where the vertical direction Z is perpendicular to the major upper surface 50U of the substrate 50 and points away from the substrate 50. In other words, a nanostructure (e.g., 54C) further away from the substrate 50 has a thicker interfacial layer 120B than a nanostructure (e.g., 54A) closer to the substrate 50. This may be caused by the anisotropicity of the oxidization process. For example, during the plasma oxidization process, more plasma may reach the nanostructure (e.g., 54C) at higher vertical levels. In some embodiments, the difference between the thicknesses of the interfacial layer 120B around the nanostructures (54A, 54B, and 54C) at different vertical levels may be between about 0 angstrom and about 15 angstroms in the second device region 300.

In some embodiments, due to the anisotropicity of the oxidization process, the thickness of the interfacial layer 120 (e.g., 120A, 120B) around a nanostructure 54 (e.g., 54C, 54B, or 54A) may vary at different locations. For example, the top portion 120T of the interfacial layer 120B (e.g., a portion along the upper surface of the nanostructure 54) may be thicker than the sidewall portion 120S of the interfacial layer 120B (e.g., a portion along the sidewall of the nanostructure 54), and the sidewall portion 120S may be thicker than the bottom portion 120L of the interfacial layer 120B (e.g., a portion along the lower surface of the nanostructure 54). In some embodiments, the difference between the thicknesses of the top portion 120T, the sidewall portion 120S, and the bottom portion 120L of a same nanostructure 54 in the second device region 300 may be between about 0 angstroms and about 15 angstroms. For this reason, in the discussion herein, when the thicknesses of the interfacial layer around a first nanostructure (e.g., 54C) is said to be thicker than the thickness of the interfacial layer 120 around a second nanostructure (e.g., 54A), it means that the average thickness (e.g., an average of the thicknesses of portions 120T, 120S, and 120L) of the interfacial layer 120 around the first nanostructure is thicker than the average thickness of the interfacial layer 120 around the second nanostructure. In addition, or alternatively, it may mean that a particular portion (e.g., 120T, 120S, or 120L) of the interfacial layer 120 around the first nanostructure is thicker than the same portion (e.g., 120T, 120S, or 120L) of the interfacial layer 120 around the second nanostructure.

In some embodiments, the heights (e.g., T1, T2, T3) of the nanostructures 54 in the second device region 300 may decrease along the vertical direction Z (e.g., T1<T2<T3) in FIG. 17B, where the heights are measured along the vertical direction Z between the upper surface and the lower surface of (the un-oxidized portion of) the nanostructure 54. For example, the height Ti of the nanostructure 54C is smaller than the height T3 of the nanostructure 54A, since more surface portions of the nanostructure 54C are converted (e.g., oxidized) into the interfacial layer 120 B. A difference between the heights of the nanostructures 54 at different vertical levels in the second device region 300 may be between about 0 nm and about 6 nm.

As discussed above, due to the first device region 200 being shielded by thicker hard mask layer(s) (e.g., 128 and 126) in the oxidization process, the oxidization process has reduced effect on the interfacial layer 120 in the first device region 200, or has no effect on the interfacial layer 120 in the first device region 200 if the hard mask layers (e.g., 128 and 126) completely blocks out the oxidizing agent of the oxidization process. As a result, the interfacial layer 120A at a specific vertical level (e.g., around the nanostructure 54C) in the first device region 200 is thinner than the interfacial layer 120B at the same vertical level (e.g., around the nanostructure 54C) in the second device region 300. Conversely, the height of a nanostructure (e.g., 54C) at a specific vertical level in the first device region 200 is larger than the height of a nanostructure (e.g., 54C) at the same vertical level in the second device region 300. Here the phrase "the same vertical level" is used to describe two nanostructures (e.g., 54C) having a same vertical distance from the substrate but in different device regions (e.g., 200, 300), where the vertical distance is between a horizontal center axis of the nanostructure and a major upper surface of the substrate. In some embodiments, a difference between the heights of nanostructures 54 (e.g., at the same vertical level) in the first device region 200 and the second device region 300 is between about 0 nm and about 6 nm. In some embodiments, a difference between the thicknesses of the interfacial layers 120A and 120B (e.g., at the same vertical level) in the first device region 200 and the second device region 300 is between about 0 angstroms and about angstroms. In some embodiments where the oxidization process has no effect on the interfacial layer 120 in the first device region 200, all the nanostructures 54 in the first device region 200 have a same height T, which is larger than the heights of the nanostructures 54 in the second device region 300 (e.g., T>T3>T2>T1), and the thicknesses of the interfacial layer 120A around all the nanostructures 54 in the first device region 200 have a same value, which is smaller than the smallest thickness of the interfacial layer 120B around all the nanostructures 54 in the second device region 300. In some embodiments, the sheet height gap of nanostructures 54 in the first device region 200 is smaller than the sheet height gap of nanostructures 54 in the second device region 300. The difference between the sheet height gap of nanostructures 54 in the first device region 200 and the sheet height gap of nanostructures 54 in the second device region 300 is between about 0 nm and about 10 nm, in some embodiments.

In some embodiments, the thicknesses of the gate dielectric layer 122 (e.g., along the sidewalls of the gate spacers 108 and along the nanostructures 54) in the first device region 200 and in the second device regions 300 are substantially the same, with the difference between the thicknesses being between about 0 angstroms and about 5 angstroms. In some embodiments, the compositions (e.g., the atomic percentage of nitrogen and oxygen) of the sidewalls of the gate spacers 108 facing the recesses 103 in the first device region 200 and in the second device regions 300 are different, which may be caused by the different amount of oxidizing agent reaching the gate spacers 108 (e.g., due to the different numbers of hard mask layers used) during the oxidization process. For example, the oxidization process may change the composition of the gate spacer 108 from a nitride-rich composition to an oxygen-rich composition. As a result, after the oxidization process, the gate spacer 108 in the first device region 200 may have a higher atomic percentage of nitrogen and a lower atomic percentage of oxygen than the gate spacer 108 in the second device region 300, due to the first device region 200 being shielded by thicker hard mask layer(s) (e.g., 128 and 126) in the oxidization process. In addition, in subsequent etching processes to remove the hard mask layers, the gate spacers 108 in the second device region 300, which has a higher atomic concentration of oxygen, may be damaged (e.g., etched) more easily than the gate spacer 108 in the first device region 200, and therefore, in the final product of the NSFET device 100, a thickness of the gate spacer 108 in the first device region 200 may be larger than a thickness of the gate spacer 108 in the second device region 300.

Besides using different numbers of hard mask layers (e.g., 126, 128) for the first device region 200 and the second device region 300 to achieve different thicknesses for the interfacial layers 120 (e.g., 120A, 120B) (e.g., gate oxide layer), other ways to modulate (e.g., change) the thickness of the interfacial layer 120 are also possible. As an example, the seed layer 124 may be formed to have different thicknesses in the first device region 200 and in the second device region 300. The seed layer 124 may function as another hard mask layer to affect the thickness of the interfacial layer 120. For example, the seed layer 124 may help to control the thickness of the top portion 120T of the interfacial layer 120. The seed layer 124 may also increase thickness uniformity of the interfacial layer 120 at different vertical levels. To achieve different thicknesses of the seed layer 124, a first patterned mask layer (e.g., a patterned photoresist layer) may be used to cover the first device region 200 while the seed layer 124 is formed in the second device region 300 to a first thickness. Next, the first patterned mask layer is removed, and a second patterned mask layer may be formed to cover the second device region 300 while the seed layer 124 is formed in the first device region 200 to a second thickness. Other methods for achieving different thicknesses for the seed layer 124 are possible and are fully intended to be included within the scope of the present disclosure. As another example to achieve different thicknesses for the interfacial layers 120, the parameters of the oxidization process, such as the temperature, the flow rate, or the RF power for the plasma process, may also be adjusted to achieve different thicknesses for the interfacial layers 120A/120B in different device regions (e.g., 200 and 300). By allowing different device regions (e.g., 200, 300) to have different thicknesses for the gate oxide 120, the leakage current and the power consumption of different device regions can be tuned to achieve different performance targets, thus allowing for improved performance and versatility in the design of the NSFET device 100.

Figure 18A:
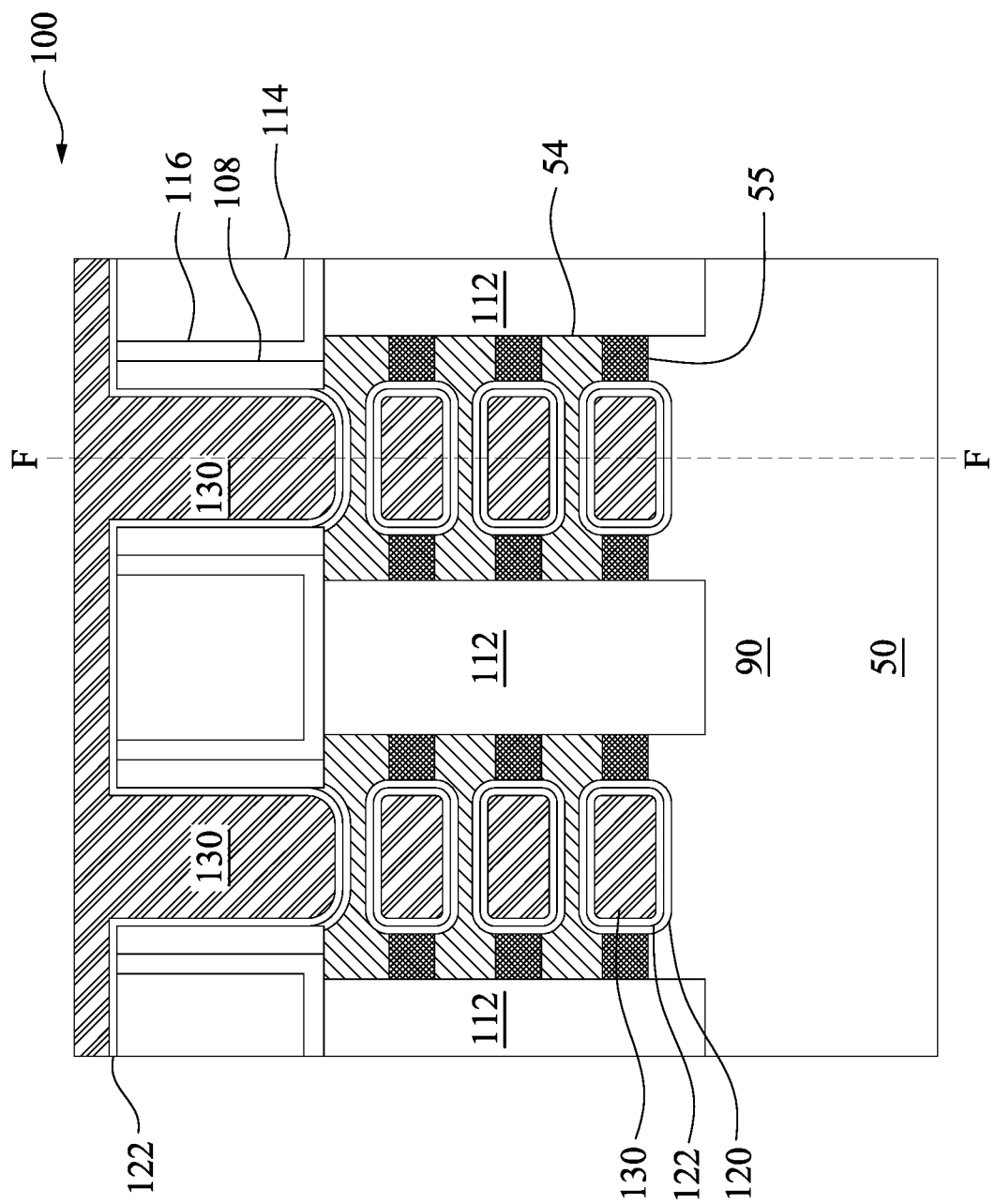
Figure 18B:
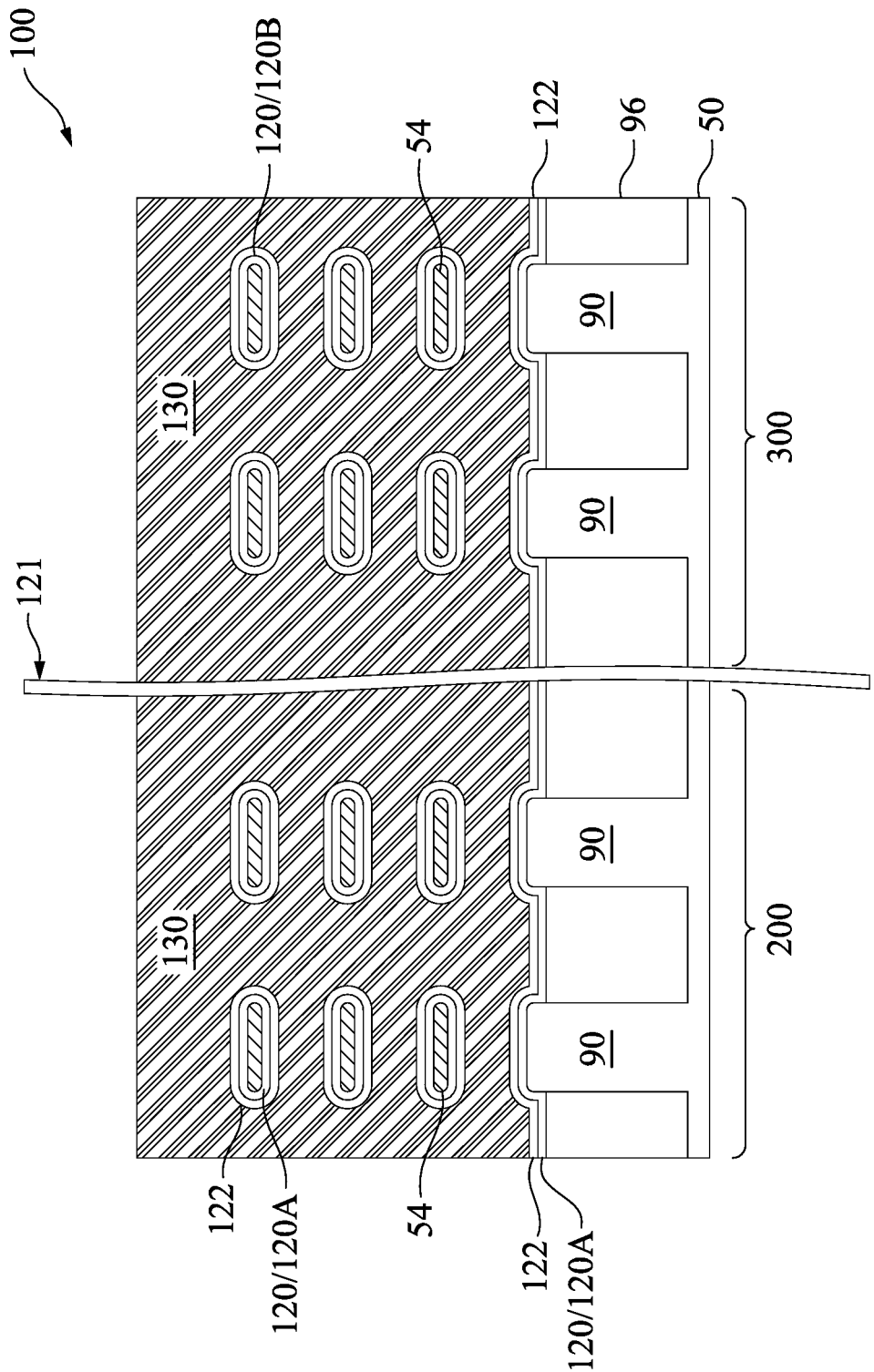

Next, in FIGS. 18A and 18B, the gate electrode 130 is deposited over and around the gate dielectric layer 122, and fills the gaps 53 and the remaining portions of the recesses 103. The gate electrode 130 may include a metal-containing material such as TiN, TiO, TaN, TaC, Co, Ru, Al, W, combinations thereof, or multi-layers thereof. For example, although a single layer gate electrode 130 is illustrated, the gate electrode may comprise any number of liner layers (e.g., barrier layers), any number of work function tuning layers, and a fill material. After the gate electrode 130 is formed, a planarization process, such as a CMP, may be performed to remove excess portions of the gate dielectric layer 122 and the gate electrode 130, which excess portions are over the top surface of the first ILD 114. The remaining portions of the gate electrode 130, the remaining portions of gate dielectric layer 122, and the interfacial layer 120 thus form replacement gates of the resulting NSFET device 100. Each gate electrode 130, and the corresponding interfacial layer 120 and the gate dielectric layer 122 may be collectively referred to as a gate stack, a replacement gate structure, or a metal gate structure. Each gate stack extends over and around the respective nanostructures 54.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed through the second ILD and/or the first ILD 114 to electrically couple to the gate electrode 130 and the source/drain regions 112, respectively.

Figure 19A:
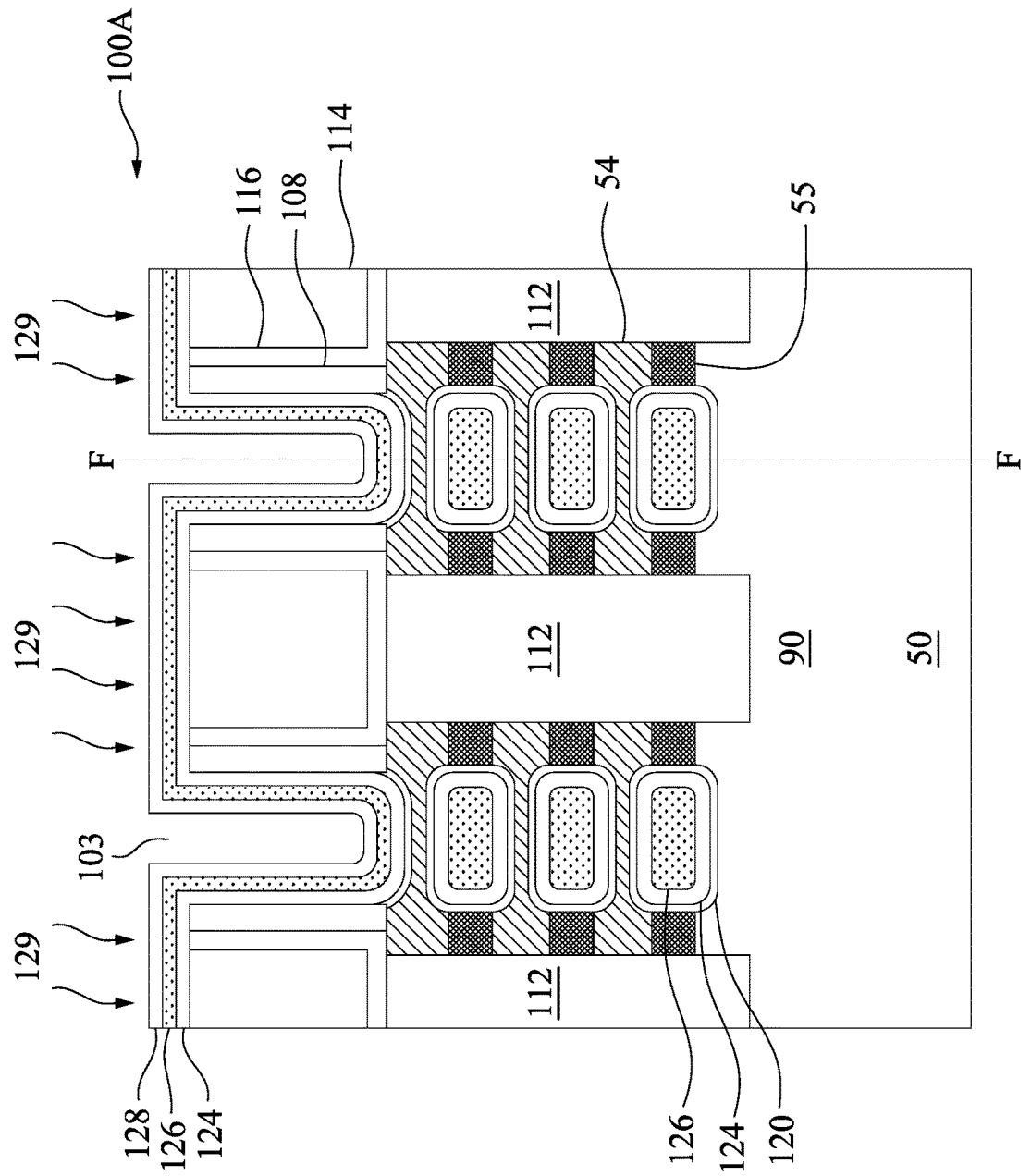
FIGS. 19A and 19B are cross-sectional views of a nanostructure field-effect transistor device at a stage of manufacturing, in accordance with an embodiment.
Figure 19B:
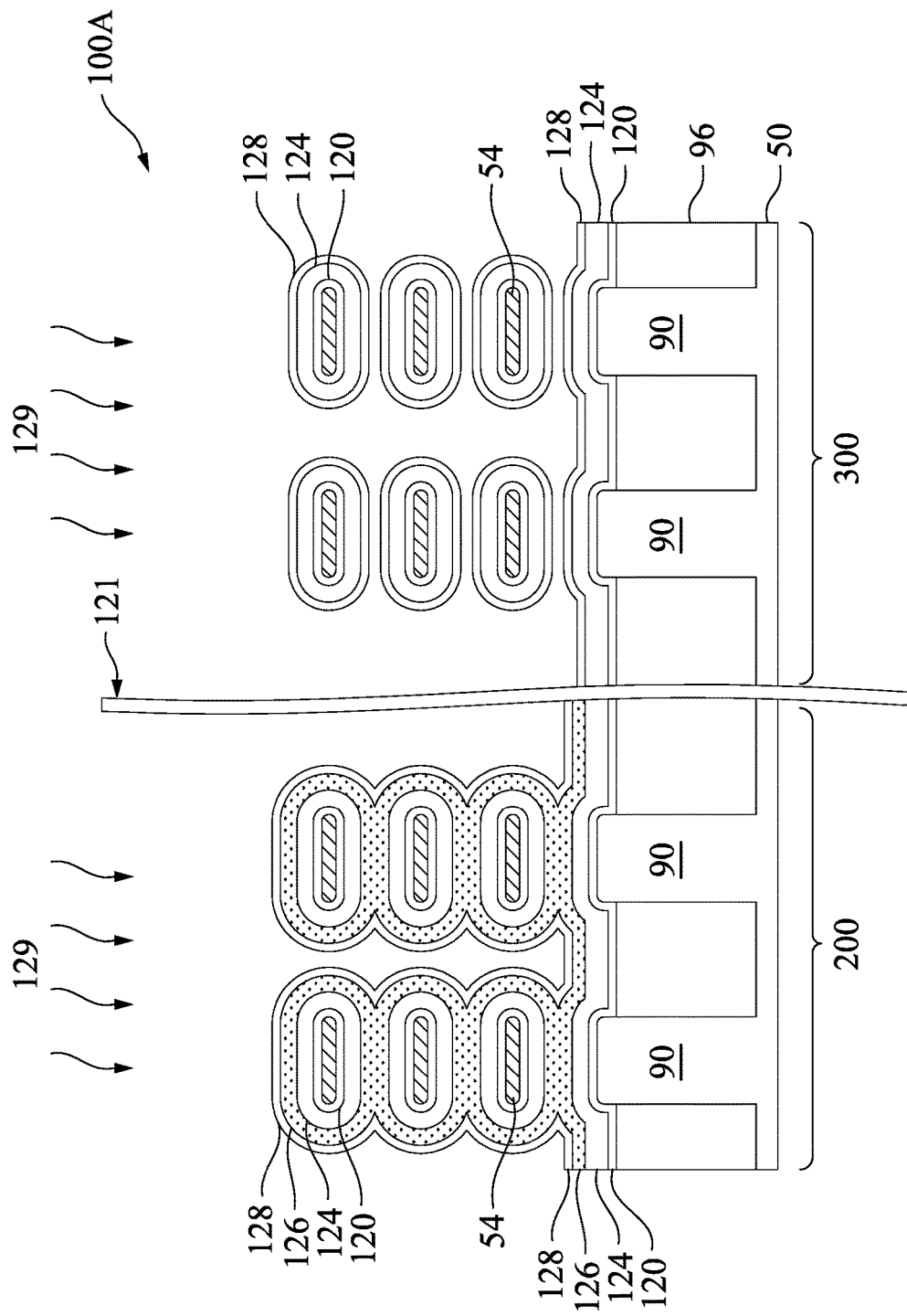

FIGS. 19A and 19B are cross-sectional views of a nanostructure field-effect transistor (NSFET) device 100A at a certain stages of manufacturing, in accordance with an embodiment. The NSFET device 100A may be formed by similar processing steps for the NSFET device 100, but with the gate dielectric layer 122 formed after the oxidization process and after the hard mask layers (e.g., 126, 128) and the seed layer are removed. FIGS. 19A and 19B illustrate cross-sectional views of the NSFET device 100A during the oxidization process 129. The oxidization process is the same as or similar to the oxidization process for the NSFET device 100, thus details are not repeated. Note that the gate dielectric layer 122 is not formed yet during the processing of FIGS. 19A and 19B.

In particular, to form the NSFET device 100A, the processing steps in FIGS. 2, 3A, 3B, 4A, 4B, 5A-5C, 6A-6C, 7A-7C, 8A, 8B, 9A, 9B, 10A, 10B, are performed. The processing in FIGS. 11A and 11B (formation of the gate dielectric layer 122) is skipped. Next, the processing steps in FIGS. 12A, 12B, 13A, 13B, 14A, 14B, 15A, 15B are performed, but without the gate dielectric layer 122 formed. Next, the oxidization process of FIGS. 19A and 19B is performed. Next, the hard mask layers e.g., 128, 126) and the seed layer 124 are removed to expose the interfacial layer 120, and the gate dielectric layer 122 is formed on the exposed interfacial layer 120, along sidewalls of the gate spacers 108, and along the upper surface of the first ILD 114, as illustrated in FIGS. 17A and 17B. Next, the gate electrode 130 is formed, as illustrated in FIGS. 18A and 18B.

Variations of the disclosed embodiments are possible and are fully intended to be included within the scope of the present disclosure. For example, for the NSFET devices 100 and 100A, the second hard mask layer 128 is optional and may be omitted. In addition, the seed layer 124 is optional and may be omitted. As another example, depending on the type of device (e.g., n-type or p-type device) formed, the second semiconductor material 54 may be removed, and the first semiconductor material 52 may remain to form the nanostructures, which nanostructures function as the channel regions of the NSFET device formed. In embodiments where the first semiconductor material 52 remains to form the nanostructures, inner spacers are formed in sidewall recesses of the second semiconductor material 54 before the second semiconductor material 54 is removed, as one of ordinary skill readily appreciates.

Figure 20:
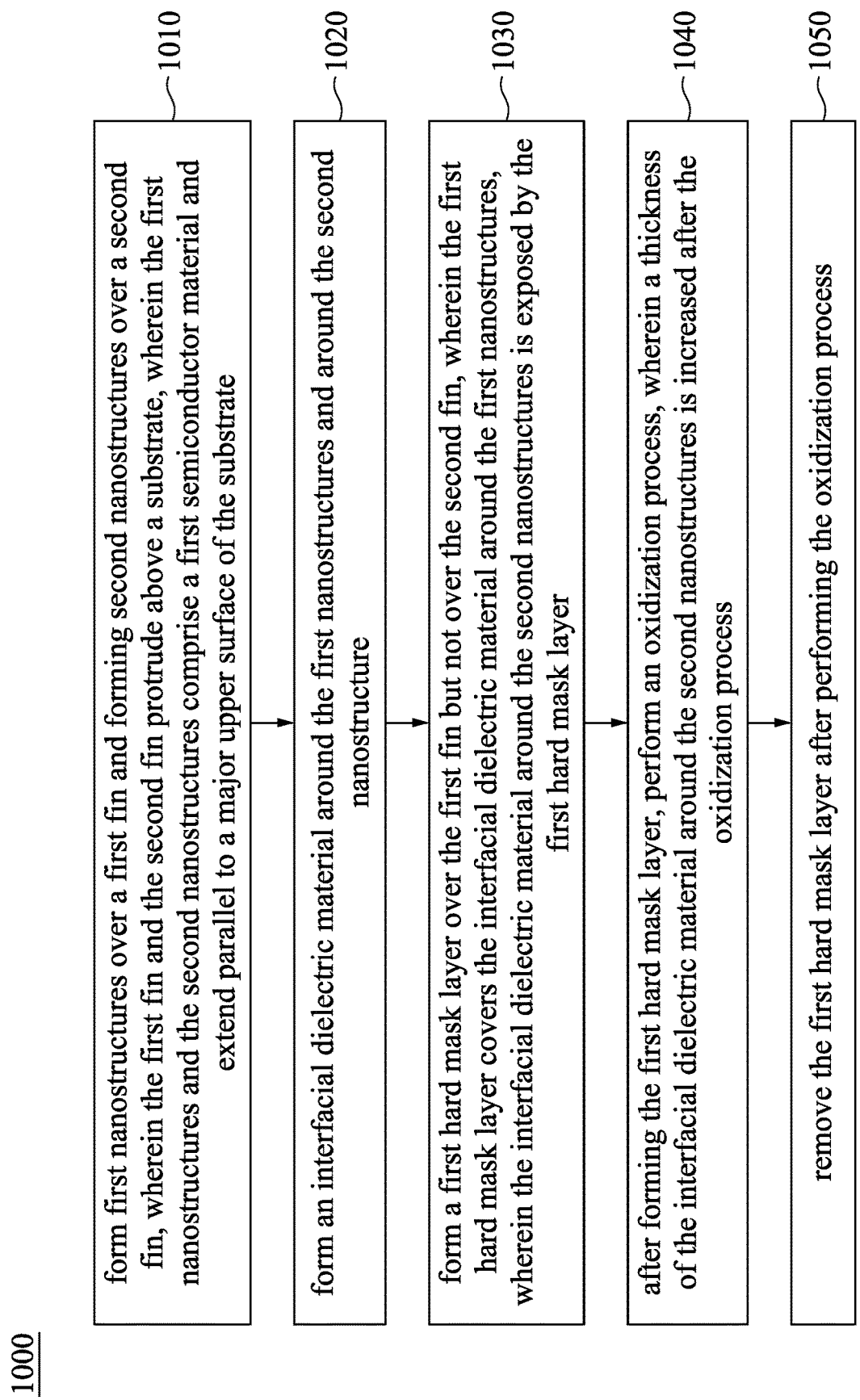
FIG. 20 is a flow chart of a method of forming a semiconductor device, in some embodiments.

FIG. 20 illustrates a flow chart of a method of fabricating a semiconductor device, in accordance with some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged, or repeated.

Referring to FIG. 20, at block 1010, first nanostructures are formed over a first fin and second nanostructures are formed over a second fin, wherein the first fin and the second fin protrude above a substrate, wherein the first nanostructures and the second nanostructures comprise a first semiconductor material and extend parallel to a major upper surface of the substrate. At block 1020, an interfacial dielectric material is formed around the first nanostructures and around the second nanostructure. At block 1030, a first hard mask layer is formed over the first fin but not over the second fin, wherein the first hard mask layer covers the interfacial dielectric material around the first nanostructures, wherein the interfacial dielectric material around the second nanostructures is exposed by the first hard mask layer. At block 1040, after forming the first hard mask layer, an oxidization process is performed, wherein a thickness of the interfacial dielectric material around the second nanostructures is increased after the oxidization process. At block 1050, the first hard mask layer is removed after performing the oxidization process.

Embodiments may achieve advantages. The disclosed embodiments allow for different thicknesses for the gate oxide in different device regions of a semiconductor device. This allows devices with different performance targets, such as leakage current and power consumption, to be formed in different devices regions of a same semiconductor device. The disclosed embodiments offers various ways to modulate the gate oxide thickness in different device regions, such as by changing the number of hard mask layers, forming or not forming the seed layers 124, and adjusting the oxidization process conditions. Advantages of forming the seed layer 124 include the ability to adjust the thickness of the gate oxide at upper surfaces of the nanostructures 54, and improved thickness uniformity of the gate oxide at different vertical levels.

In an embodiment, a method of forming a semiconductor device includes: forming, in a first device region of the semiconductor device, first nanostructures over a first fin, the first fin protruding above a substrate; forming, in a second device region of the semiconductor device, second nanostructures over a second fin, the second fin protruding above the substrate, wherein the first nanostructures and the second nanostructures comprise a semiconductor material and extend parallel to a major upper surface of the substrate; forming a dielectric material around the first nanostructures and around the second nanostructures; forming a first hard mask layer in the first device region around the first nanostructures and in the second device region around the second nanostructures; removing the first hard mask layer from the second device region after forming the first hard mask layer; and after removing the first hard mask layer from the second device region, increasing a first thickness of the dielectric material around the second nanostructures by performing an oxidization process. In an embodiment, a second thickness of the dielectric material around the first nanostructures remains unchanged before and after the oxidization process, or is increased less by the oxidization process than the first thickness of the dielectric material around the second nanostructures. In an embodiment, the dielectric material is an oxide of the semiconductor material. In an embodiment, the oxidization process converts exterior portions of the second nanostructures into the dielectric material, wherein the first hard mask layer shields the first nanostructures from the oxidization process. In an embodiment, performing the oxidization process comprises soaking the first nanostructures and the second nanostructures in a gas source comprising ozone. In an embodiment, the oxidization process is a plasma process. In an embodiment, performing the oxidization process comprises: igniting a gas source into a plasma, wherein the gas source comprises oxygen gas, nitrous oxide gas, a mixture of nitrous oxide gas and nitrogen gas, a mixture of oxygen gas and nitrogen gas, a mixture of oxygen gas and an inert gas, or a mixture of nitrous oxide gas and an inert gas; and treating the first nanostructures and the second nanostructures with the plasma. In an embodiment, the method further includes before forming the first hard mask layer, forming a high-k gate dielectric material on the dielectric material. In an embodiment, the method further includes after forming the high-k gate dielectric material and before forming the first hard mask layer, forming a seed layer on the high-k gate dielectric material. In an embodiment, the method further includes, after removing the first hard mask layer from the second device region and before increasing the first thickness of the dielectric material, forming a second hard mask layer in the first device region on the first hard mask layer and in the second device region around the second nanostructures. In an embodiment, the method further includes, after increasing the first thickness of the dielectric material: removing the first hard mask layer from the first device region; and forming a gate electrode around the first nanostructures and around the second nanostructures. In an embodiment, the method further includes, after removing the first hard mask layer from the first device region and before forming the gate electrode, forming a high-k gate dielectric material around the first nanostructures and around the second nanostructures.

In an embodiment, a method of forming a semiconductor device includes: forming first nanostructures over a first fin and forming second nanostructures over a second fin, wherein the first fin and the second fin protrude above a substrate, wherein the first nanostructures and the second nanostructures comprise a first semiconductor material and extend parallel to a major upper surface of the substrate; forming an interfacial dielectric material around the first nanostructures and around the second nanostructures; forming a first hard mask layer over the first fin but not over the second fin, wherein the first hard mask layer covers the interfacial dielectric material around the first nanostructures, wherein the interfacial dielectric material around the second nanostructures is exposed by the first hard mask layer; after forming the first hard mask layer, performing an oxidization process, wherein a thickness of the interfacial dielectric material around the second nanostructures is increased after the oxidization process; and removing the first hard mask layer after performing the oxidization process. In an embodiment, the method further includes, after removing the first hard mask layer, forming a gate electrode around the first nanostructures and around the second nanostructures. In an embodiment, the interfacial dielectric material is an oxide of the first semiconductor material, wherein the oxidization process converts exterior portions of the second nanostructures into the oxide of the first semiconductor material. In an embodiment, performing the oxidization process comprises soaking the first nanostructures and the second nanostructures in an oxygen-containing gas source. In an embodiment, performing the oxidization process comprises treating the first nanostructures and the second nanostructures using a plasma of an oxygen-containing gas source.

In an embodiment, a semiconductor device includes: a first fin and a second fin that protrude above a substrate; first nanostructures and second nanostructures over the first fin and the second fin, respectively, wherein the first nanostructures and the second nanostructures comprise a first semiconductor material and extend parallel to a major upper surface of the substrate; a first interfacial dielectric layer around the first nanostructures and a second interfacial dielectric layer around the second nanostructures, wherein the second interfacial dielectric layer around the second nanostructures is thicker than the first interfacial dielectric layer around the first nanostructures; a gate dielectric layer on the first interfacial dielectric layer around the first nanostructures and on the second interfacial dielectric layer around the second nanostructures; and a gate electrode around the first nanostructures and around the second nanostructures. In an embodiment, the first interfacial dielectric layer and the second interfacial dielectric layer comprise an oxide of the first semiconductor material. In an embodiment, a first nanostructure of the first nanostructures has a first height measured between an upper surface of the first nanostructure distal from the substrate and a lower surface of the first nanostructure facing the substrate, and a second nanostructure of the second nanostructures has a second height measured between an upper surface of the second nanostructure distal from the substrate and a lower surface of the second nanostructure facing the substrate, wherein the first height is larger than the second height, wherein the first nanostructure and the second nanostructure have a same vertical distance from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin and a second fin that protrude above a substrate;
   first nanostructures and second nanostructures over the first fin and the second fin, respectively, wherein the first nanostructures and the second nanostructures comprise a same semiconductor material and extend parallel to a major upper surface of the substrate;
   a first interfacial dielectric layer around the first nanostructures and a second interfacial dielectric layer around the second nanostructures, wherein the second interfacial dielectric layer around the second nanostructures is thicker than the first interfacial dielectric layer around the first nanostructures, wherein a thickness of the second interfacial dielectric layer increases along a first direction that is perpendicular to the major upper surface of the substrate and points away from the substrate toward the second nanostructures;
   a gate dielectric layer on the first interfacial dielectric layer around the first nanostructures and on the second interfacial dielectric layer around the second nanostructures; and
   a gate electrode material around the first nanostructures and around the second nanostructures.

2. The semiconductor device of claim 1, wherein a thickness of the first interfacial dielectric layer remains unchanged along the first direction.

3. The semiconductor device of claim 2, wherein the second nanostructures have heights that decrease along the first direction.

4. The semiconductor device of claim 3, wherein the first nanostructures have heights that remain unchanged along the first direction.

5. The semiconductor device of claim 1, wherein the first interfacial dielectric layer and the second interfacial dielectric layer comprise an oxide of the same semiconductor material, wherein the gate dielectric layer is a high-k dielectric material.

6. The semiconductor device of claim 1, wherein a thickness of the first interfacial dielectric layer around a first one of the first nanostructures is uniform, and a thickness of the second interfacial dielectric layer around a first one of the second nanostructures is non-uniform, wherein the first one of the first nanostructures and the first one of the second nanostructures are at a same vertical distance from the major upper surface of the substrate.

7. The semiconductor device of claim 6, wherein the thickness of the second interfacial dielectric layer around the first one of the second nanostructures has a first value at an upper surface of the first one of the second nanostructures, has a second value at a sidewall of the first one of the second nanostructures, and has a third value at a lower surface of the first one of the second nanostructures, wherein the first value, the second value, and the third value are different from one another.

8. The semiconductor device of claim 7, wherein the first value is larger than the second value, and the second value is larger than the third value.

9. The semiconductor device of claim 7, wherein the thickness of the first interfacial dielectric layer around the first one of the first nanostructures is smaller than a smallest value among the first value, the second value, and the third value.

10. The semiconductor device of claim 1, wherein the first fin is in a first device region, and the second fin is in a second device region, wherein the first device region and the second device region are N-type device regions or P-type device regions.

11. A semiconductor device comprising:
a substrate;
a first fin in a first device region and protruding above the substrate;
a second fin in a second device region and protruding above the substrate;
first nanostructures and second nanostructures over the first fin and the second fin, respectively;
a first interfacial dielectric material and a second interfacial dielectric material around the first nanostructures and the second nanostructures, respectively, wherein the first interfacial dielectric material around each of the first nanostructures has a uniform thickness, wherein the second interfacial dielectric material around each of the second nanostructures has a non-uniform thickness, wherein the second interfacial dielectric material around a lower one of the second nanostructures has a smaller thickness than the second interfacial dielectric material around an upper one of the second nanostructures, wherein the upper one of the second nanostructures extends further from the substrate than the lower one of the second nanostructures;
a high-k gate dielectric layer on the first interfacial dielectric material around the first nanostructures and on the second interfacial dielectric material around the second nanostructures; and
a first gate electrode and a second gate electrode around the first nanostructures and the second nanostructures, respectively.

12. The semiconductor device of claim 11, wherein the non-uniform thickness of the second interfacial dielectric material around each of the second nanostructures has a first value, a second value, and a third value at an upper surface, a sidewall, and a lower surface of the each of the second nanostructures, respectively, wherein the first value is larger than the second value, and the second value is larger than the third value.

13. The semiconductor device of claim 11, wherein the first interfacial dielectric material around a lower one of the first nanostructures has a same thickness as the first interfacial dielectric material around an upper one of the first nanostructures, wherein the upper one of the first nanostructures extends further from the substrate than the lower one of the first nanostructures.

14. The semiconductor device of claim 12, wherein the uniform thickness of the first interfacial dielectric material is smaller than a smallest value among the first value, the second value, and the third value.

15. The semiconductor device of claim 11, wherein both the first device region and the second device region are N-type device regions or P-type device regions.

16. A semiconductor device comprising:
a substrate;
a first fin and a second fin that protrude above the substrate;
first nanostructures and second nanostructures over the first fin and the second fin, respectively, wherein each of the first nanostructures has a respective first height, and each of the second nanostructures has a respective second height, wherein the second heights of the second nanostructures increase along a vertical direction from an uppermost one of the second nanostructures toward the substrate, wherein the first heights of the first nanostructures remain substantially the same along the vertical direction;
a first interfacial dielectric material and a second interfacial dielectric material around the first nanostructures and the second nanostructures, respectively, wherein the second interfacial dielectric material around each of the second nanostructures has a first value, a second value, and a third value at an upper surface, a sidewall, and a lower surface of the each of the second nanostructures, respectively, wherein the first value is larger than the second value, and the second value is larger than the third value;
a high-k gate dielectric layer on the first interfacial dielectric material around the first nanostructures and on the second interfacial dielectric material around the second nanostructures; and
a first gate electrode and a second gate electrode around the first nanostructures and the second nanostructures, respectively.

17. The semiconductor device of claim 16, wherein the first interfacial dielectric material around each of the first nanostructures has a uniform thickness, wherein the second interfacial dielectric material around each of the second nanostructures has a non-uniform thickness.

18. The semiconductor device of claim 16, wherein the first height of a first one of the first nanostructures is larger than the second height of a second one of the second nanostructures, wherein the first one of the first nanostructures and the second one of the second nanostructures are at a same vertical distance from the substrate.

19. The semiconductor device of claim 16, wherein the second interfacial dielectric material around a lower one of the second nanostructures has a smaller thickness than the second interfacial dielectric material around an upper one of the second nanostructures, wherein the lower one of the second nanostructures is between the upper one of the second nanostructures and the substrate.

20. The semiconductor device of claim 16, wherein a first thickness of the first interfacial dielectric material around a first one of the first nanostructures is smaller than a second thickness of the second interfacial dielectric material around a second one of the second nanostructures, wherein the first one of the first nanostructures and the second one of the second nanostructures are at a same distance from the substrate.

* * * * *